United States Patent
Tanaka et al.

(10) Patent No.: US 9,362,392 B2
(45) Date of Patent: Jun. 7, 2016

(54) VERTICAL HIGH-VOLTAGE SEMICONDUCTOR DEVICE AND FABRICATION METHOD THEREOF

(71) Applicant: FUJI ELECTRIC CO., LTD., Kawasaki-shi, Kanagawa (JP)

(72) Inventors: Atsushi Tanaka, Tsukuba (JP); Noriyuki Iwamuro, Tsukuba (JP); Shinsuke Harada, Tsukuba (JP)

(73) Assignee: FUJI ELECTRIC CO., LTD., Kawasaki-shi (JP)

( * ) Notice: Subject to any disclaimer, the term of this patent is extended or adjusted under 35 U.S.C. 154(b) by 0 days.

(21) Appl. No.: 14/396,615

(22) PCT Filed: Mar. 14, 2013

(86) PCT No.: PCT/JP2013/057123
§ 371 (c)(1),
(2) Date: Oct. 23, 2014

(87) PCT Pub. No.: WO2013/161420
PCT Pub. Date: Oct. 31, 2013

(65) Prior Publication Data
US 2015/0076521 A1 Mar. 19, 2015

(30) Foreign Application Priority Data

Apr. 24, 2012 (JP) ................ 2012-098994

(51) Int. Cl.
*H01L 29/78* (2006.01)
*H01L 29/16* (2006.01)
(Continued)

(52) U.S. Cl.
CPC ...... *H01L 29/7802* (2013.01); *H01L 21/02529* (2013.01); *H01L 21/046* (2013.01);
(Continued)

(58) Field of Classification Search
CPC ............. H01L 29/1608; H01L 29/66712; H01L 29/7802; H01L 29/1095
See application file for complete search history.

(56) References Cited

U.S. PATENT DOCUMENTS

| 2006/0057796 A1 | 3/2006 | Harada et al. |
| 2009/0096020 A1 | 4/2009 | Yamanobe |

(Continued)

FOREIGN PATENT DOCUMENTS

| JP | 2006-19608 A | 1/2006 |
| JP | 2009-99714 A | 5/2009 |

(Continued)

OTHER PUBLICATIONS

Deboy et al., "A new generation of high voltage MOSFETs breaks the limit line of silicon", IEEE IEDM, 1998, pp. 683-685.
(Continued)

*Primary Examiner* — Amar Movva
(74) *Attorney, Agent, or Firm* — Westerman, Hattori, Daniels & Adrian, LLP

(57) ABSTRACT

To provide a vertical SIC-MOSFET and IGBT capable of having low ON-resistance without destruction of gate oxide films or degradation of reliability even when a high voltage is applied, and a fabrication method thereof, a vertical mosfet has a semiconductor layer and a base layer joined instead of a well region 6 so as to include, as a joining portion, a point that is farthest and equidistant from centers of all the source regions facing each other and that is closest and equidistant from end portions farthest from the centers of the source regions in a planar view.

12 Claims, 12 Drawing Sheets

(51) Int. Cl.
    *H01L 29/66*   (2006.01)
    *H01L 29/739*  (2006.01)
    *H01L 29/06*   (2006.01)
    *H01L 29/10*   (2006.01)
    *H01L 21/02*   (2006.01)
    *H01L 21/04*   (2006.01)
    *H01L 29/04*   (2006.01)

(52) U.S. Cl.
    CPC .......... *H01L29/045* (2013.01); *H01L 29/0696* (2013.01); *H01L 29/1095* (2013.01); *H01L 29/1608* (2013.01); *H01L 29/66068* (2013.01); *H01L 29/66333* (2013.01); *H01L 29/66712* (2013.01); *H01L 29/7395* (2013.01)

(56) References Cited

U.S. PATENT DOCUMENTS

| | | |
|---|---|---|
| 2010/0258815 A1 | 10/2010 | Tarui |
| 2011/0095305 A1 | 4/2011  | Yamashita et al. |
| 2012/0056195 A1 | 3/2012  | Kono et al. |

FOREIGN PATENT DOCUMENTS

| | | |
|---|---|---|
| JP | 2010-245389 A | 10/2010 |
| JP | 2010-267762 A | 11/2010 |
| JP | 2012-59744 A  | 3/2012  |
| WO | 2004/036655 A1 | 4/2004 |
| WO | 2010/021146 A1 | 2/2010 |

OTHER PUBLICATIONS

Fujihira, "Theory of Semiconductor Superjunction Devices" Jpn. J. Appl. Phys., vol. 36, Part 1, No. 10, Oct. 1997, pp. 6254-6262.

Shenai et al., "Optimum Semiconductors for High-Power Electronics", IEEE Transactions of Electron Devices, vol. 36, 1989, pp. 1811-1822.

International Search Report dated Apr. 23, 2013 issued in corresponding application No. PCT/JP2013/057123.

Office Action dated May 8, 2015 issued in corresponding Japanese application No. 2014-512408 (with partial English translation) (6 pages).

Office Action dated May 12, 2015 issued in corresponding Japanese application No. 2014-512408 (with partial English translation) (6 pages).

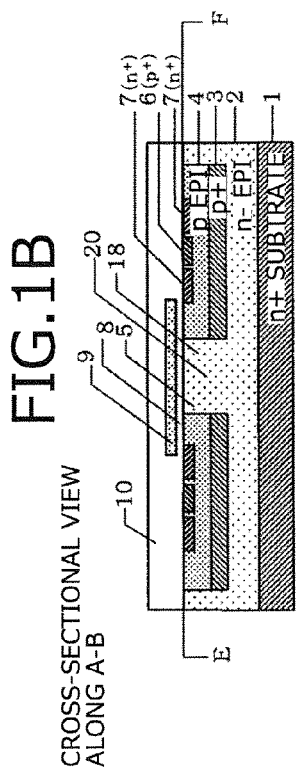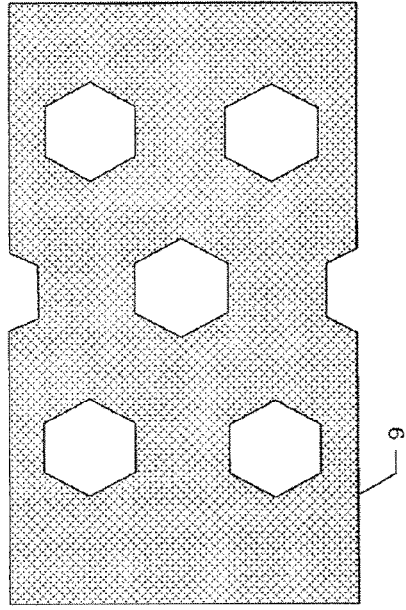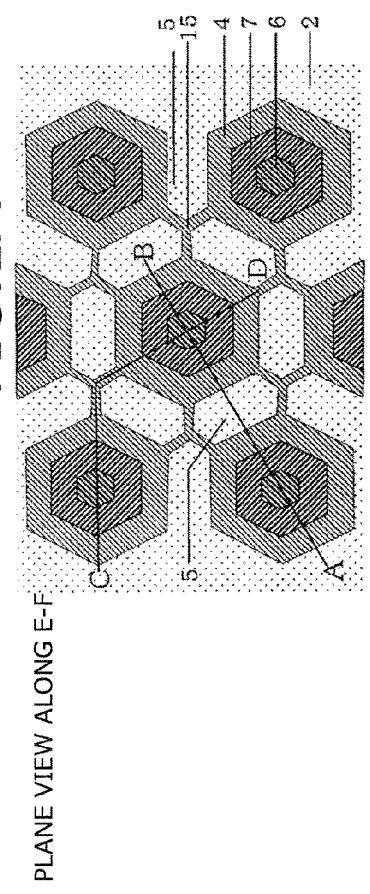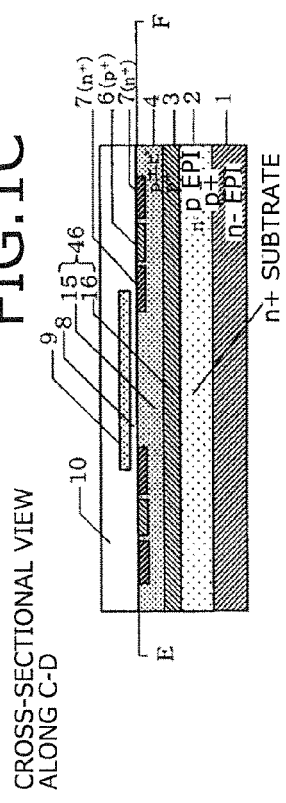

CROSS-SECTIONAL VIEW
ALONG A-B

CROSS-SECTIONAL VIEW
ALONG C-D

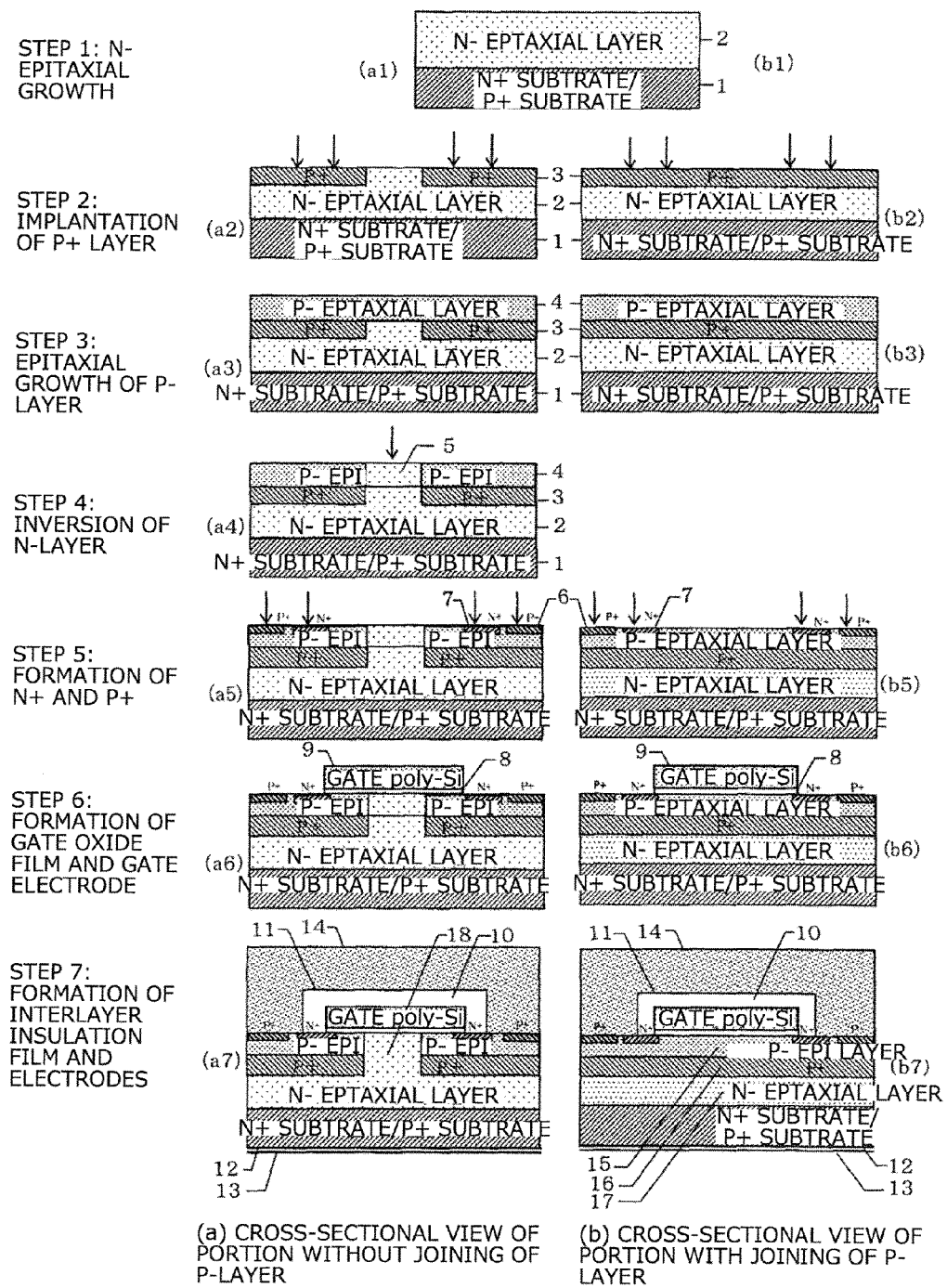

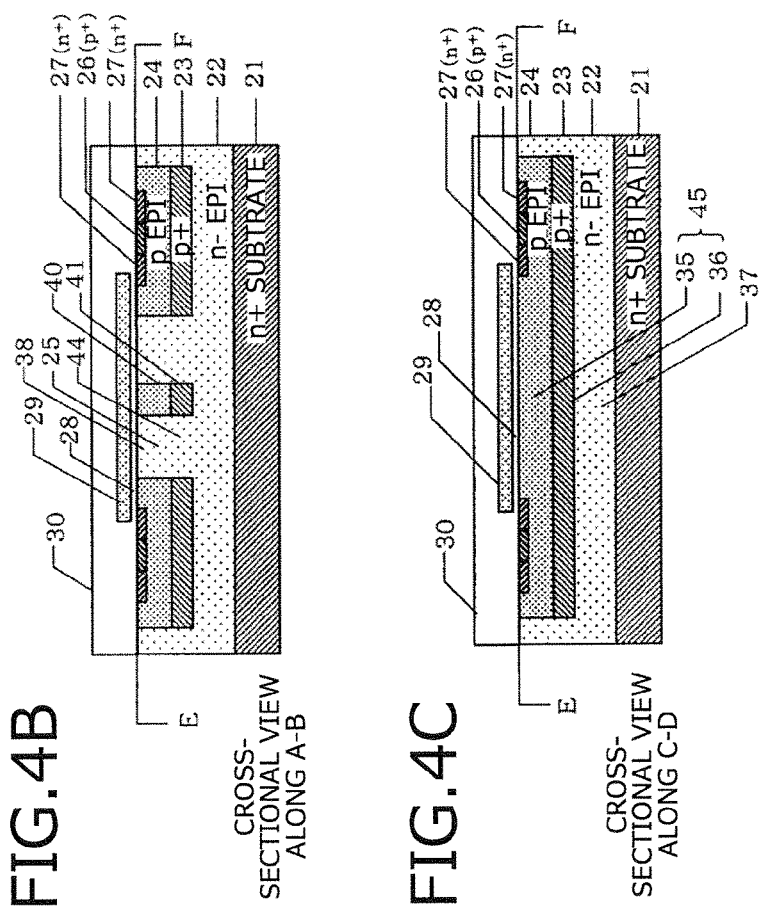
FIG.4B
FIG.4C
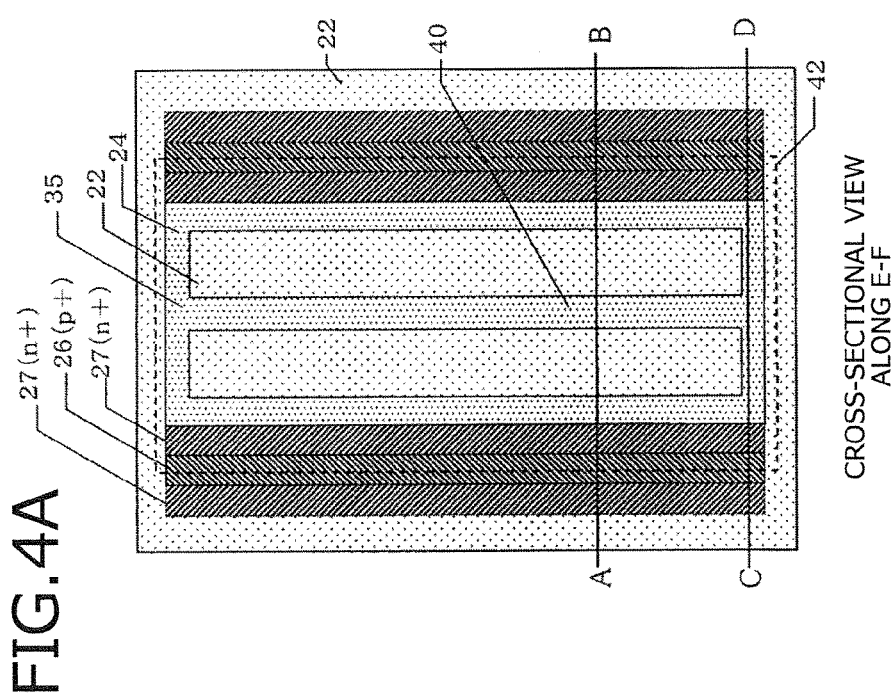
FIG.4A

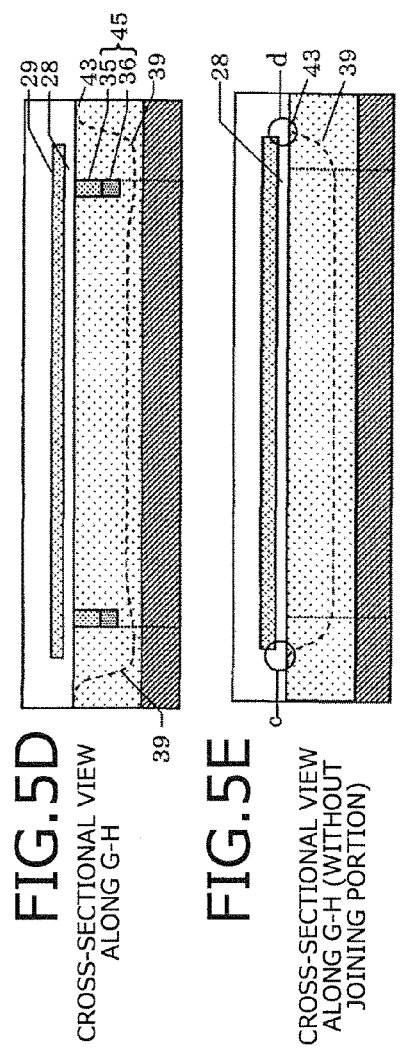
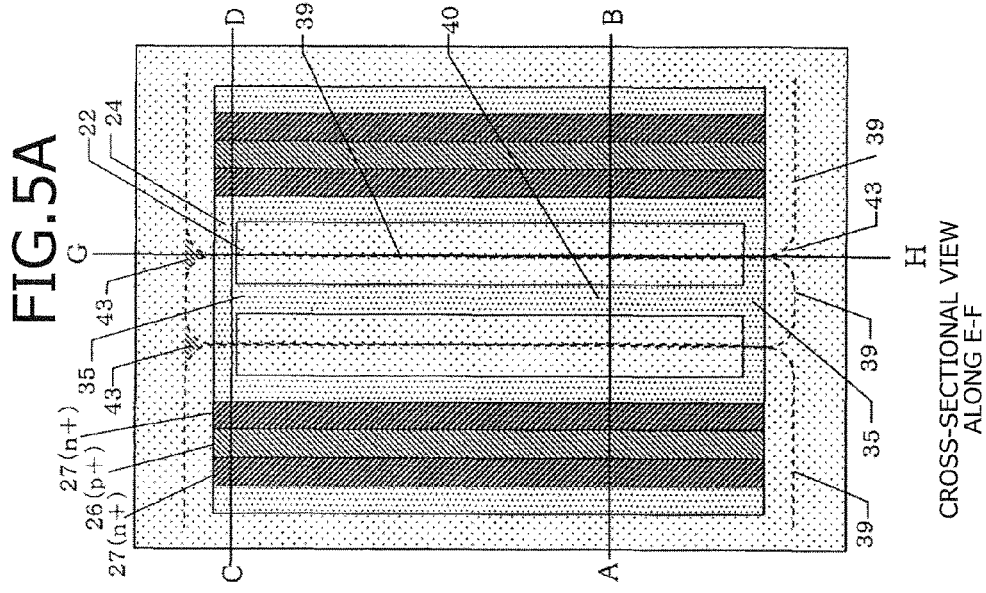

FIG. 11

TABLE 1

| | PRESENT INVENTION | | | | | CONVENTIONAL TECHNIQUE | |
|---|---|---|---|---|---|---|---|
| | FIRST EMBODIMENT | SECOND EMBODIMENT | THIRD EMBODIMENT | FOURTH EMBODIMENT | FIFTH EMBODIMENT | CONVENTIONAL SiC MOSFET | Si-IGBT |
| ELEMENT BREAKDOWN VOLTAGE (RT) | 1452V | 1453V | 1455V | 1455V | 1459V | 880V | 1448V |
| ON-RESISTANCE (RT) | 2.85Ωcm$^2$ | 4.27Ωcm$^2$ | 3.09Ωcm$^2$ | 2.90Ωcm$^2$ | 4.40Ωcm$^2$ | 2.80Ωcm$^2$ | 11.2Ωcm$^2$ |
| TURN-OFF LOSS (150°C) | 0.85mJ | 0.86mJ | 0.85mJ | 0.89mJ | 0.90mJ | 0.89mJ | 2.10mJ |
| TURN-ON LOSS (150°C) | 0.90mJ | 0.98mJ | 0.92mJ | 0.90mJ | 0.92mJ | 0.98mJ | 3.10mJ |
| GATE THRESHOLD VALUE (175°C) | 3.2V | 3.2V | 3.3V | 3.2V | 3.3V | 3.2V | 3.9V |
| TURN-OFF TOLERANCE (175°C) | >100A | >100A | >100A | >100A | >100A | 20A | >100A |
| SHORT CIRCUIT CAPABILITY (175°C) | >15μs | >15μs | >15μs | >15μs | >15μs | 3.8μs | 4.8μs |

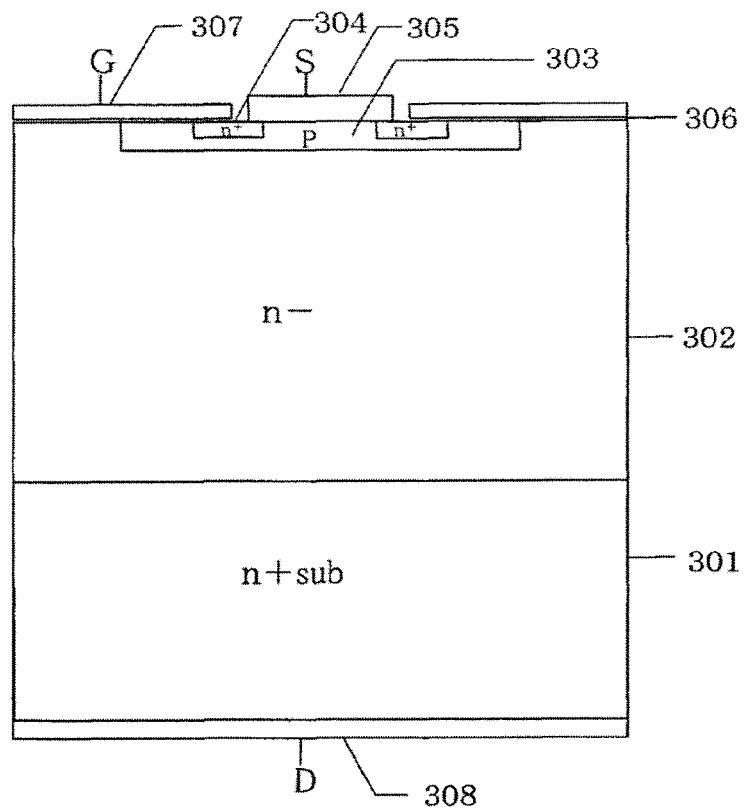
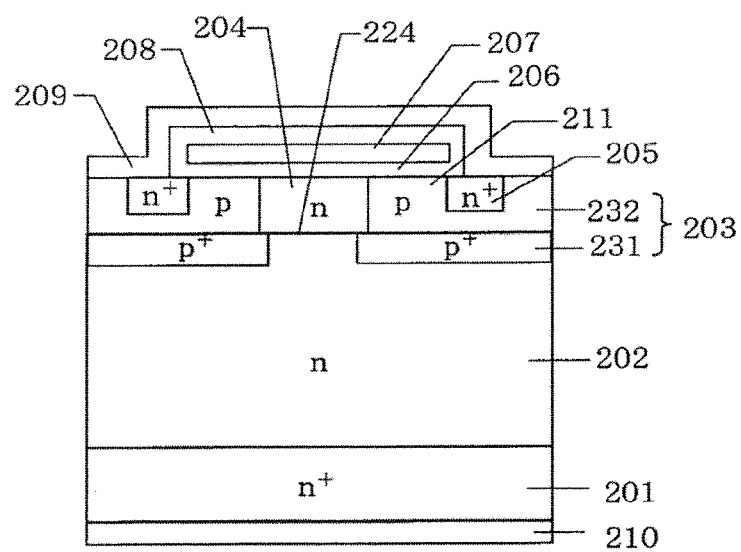

PLANE VIEW ALONG I-J

CROSS-SECTIONAL VIEW ALONG E-F

VERTICAL HIGH-VOLTAGE SEMICONDUCTOR DEVICE AND FABRICATION METHOD THEREOF

TECHNICAL FIELD

The present invention relates to a silicon carbide semiconductor device formed on a silicon carbide (SiC) substrate and a fabrication method thereof. The present invention further relates to a power semiconductor device capable of controlling high breakdown voltage and large current and particularly to a vertical high-voltage semiconductor device and an IGBT using silicon carbide, which is a wide band gap material, as a semiconductor, and a fabrication method thereof.

BACKGROUND ART

Silicon monocrystal is conventionally used as material for power semiconductor elements controlling high breakdown voltage and large current. At present, power semiconductor elements fall into several types, which are selectively used according to the intended use. For example, since bipolar transistors and insulated gate bipolar transistors (IGBTs) cannot be switched at high speed although current density can be increased, the use of bipolar transistors is limited up to several kHz and the use of IGBTs is limited up to about 20 kHz. On the other hand, power MOSFETs can be used at high speeds up to several MHz although large current cannot be handled.

However, since a power device supporting both large current and high-speed performance is strongly demanded by the market, particular efforts are made to improve IGBTs and power MOSFETs, which substantially reach the theoretical limit decided by materials.

FIG. 12 depicts a cross-sectional structure of a conventional MOSFET. An $n^-$ drift layer 302 is disposed on an $n^+$ substrate (sub) 301; a p-base layer 303 is laminated on the $n^-$ drift layer 302; an $n^+$ source layer 304 is selectively formed in a surface layer of the p-base layer 303; and a gate electrode 307 is formed on the $n^-$ drift layer 302 and the p-base layer 303 as well as the $n^+$ source layer 304 via a source electrode 305 and a gate insulating film 306. Reference numeral 308 denotes a drain electrode.

Moreover, superjunction MOSFETs have recently gained attention. Superjunction MOSFETs are known as being published as a theory by Fujihira, et al in 1997 (see Non-Patent Literature 1) and being put into production as CoolMOSFET by Deboy, et al in 1998 (see Non-Patent Literature 2). These MOSFETs are characterized in that a P-layer is vertically formed into a columnar structure in an $n^-$ drift layer so as to drastically improve ON-resistance without deterioration in breakdown voltage characteristics between the source and drain.

Semiconductor materials are also studied in terms of power semiconductor elements and, as reported by Shenai (see Non-Patent Literature 3), SiC is recently attracting particular attention as a next generation power semiconductor element because the element is excellent in terms of low ON-voltage and high-speed/high-temperature properties. This is because SiC is, chemically, a very stable material with a wide band gap of 3 eV and can be used very stably as a semiconductor, even at high temperatures. Another reason for the recent attention is that SiC has a maximum field strength higher by one or more digits than silicon. SiC is very likely to exceed the material limit of silicon and is therefore largely expected to grow in use as power semiconductors or particularly MOSFETs in the future. SiC is particularly expected to achieve smaller ON-resistance, and it can be expected to realize a vertical SiC-MOSFET having lower ON-resistance with high breakdown voltage characteristics maintained.

A cross-sectional view of the structure of a typical SiC-MOSFET is the same as that in the case of silicon, as depicted in FIG. 12. The p-base layer 303 is laminated on the $n^-$ drift layer 302; the $n^+$ source layer 304 is selectively formed on the surface layer of the p-base layer 303; the gate electrode 307 is formed on the $n^-$ drift layer 302 and the p-base layer 303 as well as on the $n^+$ source layer 304 via the gate insulating film 306; and the drain electrode 308 is formed on the back surface of the substrate 301.

A SiC-MOSFET formed in this way is expected to be utilized as a switching device in the form of an element switchable at high speed with low ON-resistance in power conversion equipment such as an inverter for motor control and an uninterruptible power supply (UPS). SiC is a wide band gap semiconductor material and therefore, has a critical electric field strength that is about ten times higher than that of silicon as described above, and is expected to achieve sufficiently smaller ON-resistance; however, since the critical electric field strength of a semiconductor is increased by a factor of ten, a concentrated load of the electric field to an oxide film is also increased as compared to silicon elements particularly when a high voltage is applied. Therefore, the oxide film may be destroyed in the case of SiC consequent to a factor that does not cause a problem in a silicon power device because the critical electric field strength of silicon is reached before a larger electric field is applied to the oxide film. For example, a larger electric field is applied to the gate oxide film of the SiC-MOSFET depicted in FIG. 12, which may result in destruction of the gate oxide film or a significant problem in reliability. This may occur in not only SiC-MOSFETs but also SiC-IGBTs.

This problem will be described in detail with an example depicted FIG. 13 related to the structure of FIG. 12. FIG. 13 is a cross-sectional view of a unit cell thereof. This structure has a low-concentration n-type drift layer 202 deposited on a high-concentration n-type substrate 201, a high-concentration p-type gate layer 231 formed in a surface of the n-type drift layer 202 by ion implantation, and a low-concentration p-type layer 232 further deposited thereon. An n-type source layer 205 is selectively formed in a surface portion of the low-concentration p-type layer 232; a gate electrode 207 is formed via a gate oxide film 206 while a source electrode 209 is formed via an interlayer insulating film 208; and a channel region 211 is formed in the low-concentration p-type layer 232 immediately beneath the gate oxide film 206. An n-type base layer 204 penetrating the low-concentration p-type layer 232 to the n-type drift layer 202 is selectively formed as an counter layer by ion implantation of n-type impurities from the surface. Reference numeral 210 denotes a drain electrode.

Since the channel region 211 is formed in the low-concentration p-type layer without ion implantation, this structure can increase the mobility of conduction electrons and enables fabrication of a vertical MOSFET with a smaller ON-resistance. Since a vertical channel portion 224 of a well is completely blocked at a lower voltage by a depletion layer spreading laterally from the high-concentration p-type gate layer 231 to the low-concentration n-type drift layer 202 in a blocked state of the well, this structure is characterized in that leakage from an electric field to a gate oxide film, etc. near the channel region 211 can be prevented so as to increase the source/drain breakdown voltage. The blocked state of the well is achieved when the well is closed by the depletion layer.

However, even after the depletion layer spreading laterally from the high-concentration p-type gate layer 231 to the low-concentration n-type drift layer 202 has spread in the vertical channel portion 224 of the well in this structure, if the counter layer has a lower impurity concentration and a thinner thickness, a portion of the well is not closed by the depletion layer, allowing mobile electrons to reach near the interface with the gate oxide film 206 and apply a strong electric field to the gate oxide film 206 interposed between the gate electrode 207 and the n-type base layer 204, causing dielectric breakdown, which is a problem.

Non-patent Literature 1: Fujihira, et al, JJAP, Vol. 36, Part 1, No. 10, 1997, p. 6254.

Non-patent Literature 2: Deboy, et al, IEEE IEDEM 1998, p. 683

Non-Patent Literature 3: IEEE Transaction on Electron Devices, Vol. 36, 1989, p. 1811.

DISCLOSURE OF INVENTION

Problem to be Solved by the Invention

SiC has properties exceeding the material limit of silicon, such as a wide energy gap and thermal stability, and is, therefore, largely expected to grow in use as power semiconductors and particularly, MOSFETs in the future. SiC is particularly expected to have low ON-resistance and is required to have a lower ON-resistance without destruction of the gate oxide films or drops in reliability even when high voltage is applied.

It is an object of the present invention to provide a vertical high-voltage semiconductor device having a low ON-resistance without destruction of gate oxide films or drops in reliability even when high voltage is applied, and to provide a fabrication method thereof.

It is another object of the present invention to provide a vertical SiC-MOSFET and IGBT having a low ON-resistance without destruction of gate oxide films or drops in reliability even when a high voltage is applied, and to provide a fabrication method thereof.

Means for Solving Problem

To achieve an object, (1) a unit is provided that ensures the spread of a depletion layer without a void space is provided so as not to leave a portion of a well unclosed by the depletion layer when the depletion layer completely spreads in the channel portion of the well in a vertical high-voltage semiconductor device in which an counter layer making up the channel has a lower impurity concentration and a thinner thickness.

As a result, since a well portion facing a gate oxide film is completely closed by the depletion layer, mobile electrons no longer reach the gate oxide film through the unclosed well portion, an electric field does not concentrate on the gate oxide film and the dielectric breakdown of the gate oxide film does not occur. In other words, in the vertical high-voltage semiconductor device in which the counter layer making up a channel has a lower impurity concentration and a thinner thickness, a problem can be prevented that, even after the depletion layer completely spreads in a channel portion of a well, a portion of the well is not closed by the depletion layer, allowing mobile electrons to reach near the interface with the gate oxide film and apply a strong electric field to the gate oxide film, causing dielectric breakdown.

(2) For the unit ensuring the spread of the depletion layer of (1), a joining portion is provided that includes a second-conductivity-type region for protecting the gate oxide film and a base region on a drift region such that a depletion layer generated in the drift region can be push into the drift region. The joining portion is continuously disposed integrally with respective portions of the second-conductivity-type region and the base region.

(3) For the unit ensuring the spread of the depletion layer of (1), respective portions of the second-conductivity-type region and the base region are integrally provided with joining portions including a point (a) that is farthest and equidistant from centers of all the source regions facing each other, and (b) that is closest and equidistant from end portions farthest from the centers of the source regions in a plane in the direction along a substrate surface (in a planar view).

The joining portions are configured on the basis of a configuration of the source region. In a cell electrode (source electrode), an outer shape of a surface along a substrate surface is formed into an electrode shape that is the same shape as, or a similar reduced shape of, an outer shape of the surface of the source region. In particular, the outer shape of the cell electrode (source electrode) is preferably formed into a similar reduced shape slightly smaller than the outer shape of the source region.

(4) Respective linking portions are formed for the base region provided with the source region of each cell and a second-conductivity-type region for protecting the gate oxide film facing the base region so as to include a point (a) that is farthest and equidistant from centers of all the source regions facing each other, and (b) that is closest and equidistant from end portions farthest from the centers of the source regions in a plane in the direction along a substrate surface.

(5) In the case of a hexagonal cell pattern, the joining portions are integrally disposed in respective portions of the second-conductivity-type region and the base region so as to include a point that is farthest and equidistant from the centers of all the source regions facing each other and that is closest and equidistant from end portions farthest from the centers of the source regions (a gap of outlines of depletion layers) in a planar view.

(6) In the case of a stripe cell pattern, similarly, the joining portions are integrally disposed in respective portions of the second-conductivity-type region and the base region so as to include a point that is farthest and equidistant from the centers of all the source regions facing each other and that is closest and equidistant from end portions farthest from the centers of the source regions in the planar view.

(7) For a unit ensuring the spread of a depletion layer without a void space so as not to leave a portion of a well unclosed by the depletion layer when the depletion layer completely spreads in the channel portion of the well, respective portions of the second-conductivity-type region and the base region are integrally provided with joining portions including a point (a) that is farthest and equidistant from centers of all the source regions facing each other, and (b) that is closest and equidistant from end portions farthest from the centers of the source regions in a plane in the direction along a substrate surface (in a planar view).

(8) In a fabrication method of a vertical high-voltage semiconductor device, a first-conductivity-type (n-type) SiC layer 2 acting as a drift layer is epitaxially grown on a first-conductivity-type (n-type) SiC semiconductor substrate 1; a second-conductivity-type (p-type) semiconductor layer 3 is formed by implanting ions into a predetermined region of the firstconductivity-type (n-type) SiC layer 2; a second-conductivity-type (p-type) semiconductor base layer 4 is epitaxially grown on the first-conductivity-type (n-type) SiC layer 2 and the second-conductivity-type (p-type) semiconductor layer 3; a first-conductivity-type (N-type) counter layer is formed by implanting ions into portions of the second-conductivity-type (p-type) semiconductor layer 3 and the second-conductivity-type (p-type) semiconductor base layer 4 such that respective joining portions (linking portions) of the layer 3 and the layer 4 are partially left; and a source region of a first-conductivity-type (n-type) source layer 7 and a second conductive type (p-type) contact assistant layer 6 are selectively formed in the second-conductivity-type (p-type semiconductor) base layer 4. A source electrode (not depicted) is disposed on the source region 7 and the contact assistant layer 6. A drain electrode (not depicted) is disposed on a back surface of the semiconductor substrate 1.

(9) In the fabrication method of (8), respective portions of the second-conductivity-type region and the base region are integrally provided with joining portions including a point that is farthest and equidistant from centers of all the source regions facing each other and that is closest and equidistant from end portions farthest from the centers of the source regions in a planar view. The joining portions are configured on the basis of a configuration of the source region. In a cell electrode (source electrode), an outer shape of a surface along a substrate surface is formed into an electrode shape that is the same shape as, or a similar reduced shape of, an outer shape of the surface of the source region. In particular, the outer shape of the cell electrode (source electrode) is preferably formed into a similar reduced shape slightly smaller than the outer shape of the source region.

A specific configuration is as follows.

(10) A vertical high-voltage semiconductor device is a vertical high-voltage semiconductor device having: a first-conductivity-type semiconductor substrate 1; a first-conductivity-type semiconductor layer 2 formed on the semiconductor substrate 1 and having a concentration lower than the semiconductor substrate 1; a high-concentration second-conductivity-type semiconductor layer 3 selectively formed in a surface of the semiconductor layer 2; a second-conductivity-type relatively low concentration semiconductor layer (base layer) 4 formed on the semiconductor layer 2 and the semiconductor layer 3; a first-conductivity-type source region 7 selectively formed in a surface layer of the second-conductivity-type base layer 4; a first-conductivity-type well region 20 formed to penetrate the second-conductivity-type base layer 4 from a surface to the first-conductivity-type semiconductor layer 2; a gate electrode layer disposed via a gate insulating film on at least a portion of a surface exposed portion of the second-conductivity-type base layer 4 interposed between the first-conductivity-type source region 7 and the first-conductivity-type well region 20; a source electrode 7 connected via the first-conductivity-type source region 7 and a contact auxiliary layer to the second-conductivity-type base layer 4; and a drain electrode disposed on a back surface of the first-conductivity-type semiconductor substrate 1, wherein the semiconductor layer 3 and the base layer 4 are respectively joined instead of the well region 20 so as to include as a joining portion a point that is farthest and equidistant from centers of all the source regions facing each other and that is closest and equidistant from end portions farthest from the centers of the source regions in a planar view.

(11) The vertical high-voltage semiconductor device of (10) has: a first-conductivity-type semiconductor substrate 1; a semiconductor layer 7 of the first-conductivity-type formed on the semiconductor substrate 1 by epitaxial growth and having a concentration lower than the semiconductor substrate 1; a high-concentration second-conductivity-type semiconductor layer 3 selectively formed in the semiconductor layer 2 by an ion implantation method; a second-conductivity-type semiconductor layer (base layer) 4 with a relatively low concentration formed on the semiconductor layer 2 and the semiconductor layer 3 by an epitaxial growth method; a first-conductivity-type source region 5 selectively formed in a surface layer of the second-conductivity-type base layer; and a first-conductivity-type well region 20 formed by an ion implantation method to penetrate the second-conductivity-type base layer from a surface to the first-conductivity-type semiconductor layer 2.

(12) In the vertical high-voltage semiconductor device of (10) or (11), the semiconductor material is a semiconductor material with a band gap of 2.2 eV or higher.

SiC may be 2H-SiC, 3C-SiC, 4H-SiC, and 6H-SiC having band gaps of 3.33 eV, 2.23 eV, 3.26 eV, and 2.93 eV, respectively. The band gap of SiC is specified to 2.2 eV or higher as compared to 1.12 of Si.

(13) In the vertical high-voltage semiconductor device of (10) or (11), the semiconductor material is silicon carbide.

(14) In the vertical high-voltage semiconductor device of (13), a crystallographic plane index of the first-conductivity-type semiconductor substrate indicates a plane tilted by an arbitrary angle greater than or equal to 0 degrees and less than or equal to 10 degrees relative to (000-1).

(15) In the vertical high-voltage semiconductor device of (13), a crystallographic plane index of the first-conductivity-type semiconductor substrate indicates a plane tilted by an arbitrary angle greater than or equal to 0 degrees and less than or equal to 10 degrees relative to (0001).

(16) A vertical high-voltage semiconductor device of the present invention is a vertical high-voltage semiconductor device having: a first-conductivity-type (n-type) semiconductor substrate 1; a first-conductivity-type (n-type) low impurity concentration semiconductor layer 2 formed on the first-conductivity-type (n-type) semiconductor substrate 1; a second-conductivity-type (p-type) high impurity concentration semiconductor layer 3 selectively formed in the first-conductivity-type (n-type) semiconductor layer 2; a first-conductivity-type (n-type) conductive source region 7 selectively formed in a surface layer of a second-conductivity-type (p-type) conductive base layer 4 after forming the low concentration second-conductivity-type (p-type) conductive base layer 4 on a surface of the second conductive type (p-type) semiconductor layer 3 and a surface of the exposed first conductive type (n-type) semiconductor layer 2; a first-conductivity-type (n-conductivity type) well region 20 formed to penetrate the second-conductivity-type (p-type) conductive base layer 4 from a surface to the first-conductivity-type (n-conductivity type) semiconductor layer 2 layer; a control electrode 9 formed via a gate insulating film 8 on a surface of the second-conductivity-type (p-conductivity type) base layer 4 interposed between the first-conductivity-type (n-conductivity type) source region 7 and a first-conductivity-type (n-conductivity type) well region 20, and the second-conductivity-type region and the base region are integrally provided with a joining portion including a point that is farthest and equidistant from centers of all the source regions facing each other and that is closest and equidistant from end portions farthest from the centers of the source regions in a planar view.

The second-conductivity-type (p-type) semiconductor layer 3 and the second-conductivity-type (p-conductivity type) base layer 4 have respective portions extended in a shape of the joining portion.

A contact with the source electrode is formed on the source region 7 and the base layer 4, and a drain electrode is formed on the back surface of the n-type semiconductor substrate 1.

(17) The vertical SiC-MOSFET of (16) is characterized in that the cell pattern is hexagonal.

In the case of the hexagonal cell pattern, the joining portions are extended radially (on extensions of radial lines from a center of a cell) from corner portions of the second-conductivity-type (p-type) semiconductor layer 3 and the second-conductivity-type (p-type) conductive base layer 4 making up the cell pattern, and have a width including a gap of outlines of the depletion layers. The width is set to a length such that the well portion facing the gate oxide film is completely closed by the depletion layer without mobile electrons reaching the gate oxide film through the unclosed well portion so as not to allow an electric field to concentrate on the gate oxide film.

(18) The vertical SiC-MOSFET of (16) is characterized in that the cell pattern is a stripe shape.

(19) In the vertical SiC-MOSFET of (16), the joining portions are configured to include all the gaps of the outlines of the depletion layers.

(20) An IGBT of any one of (16) to (19) characterized in that the conductivity type of the semiconductor substrate in the vertical high-voltage semiconductor device is set to the P-type.

(21) In a fabrication method of a vertical high-voltage semiconductor device, a first-conductivity-type (n-type) SiC layer 2 acting as a drift layer is epitaxially grown on a first-conductivity-type (n-type) SiC semiconductor substrate 1; a second-conductivity-type (p-type) semiconductor layer 3 is formed by implanting ions into a predetermined region of the first-conductivity-type (n-type) SiC layer 2; a second-conductivity-type (p-type) semiconductor base layer 4 is epitaxially grown on the first-conductivity-type (n-type) SiC layer 2 and the second-conductivity-type (p-type) semiconductor layer 3; a first-conductivity-type (N-type) counter layer is formed by implanting ions into portions of the second-conductivity-type (p-type) semiconductor layer 3 and the second-conductivity-type (p-type) semiconductor base layer 4 such that respective joining portions (linking portions) of the layer 3 and the layer 4 are partially left; and a first-conductivity-type (n-type) source layer and a second conductive type (p-type) contact layer are selectively formed in the second-conductivity-type (p-type semiconductor) base layer 4.

(22) In the fabrication method of (21), the second-conductivity-type region and the base region are integrally provided with joining portions including a point that is farthest and equidistant from centers of all the source regions facing each other and that is closest and equidistant from end portions farthest from the centers of the source regions in a planar view.

EFFECT OF THE INVENTION

According to the present invention, even when the impurity concentrations of the n-type semiconductor layer 2 and the n-type semiconductor well region 20 are greatly increased while the ON-resistance is sufficiently reduced or even if mutual distances are increased between the p-type semiconductor layers 3 and between the p-conductive type base layers 4 to sufficiently reduce the ON-resistance, a high electric field is not applied to the gate oxide film on the n-type semiconductor well region 20 and sufficient element breakdown voltage can be retained even if high voltage is applied between the source and the drain (the source is 0 V and a positive voltage is applied to the drain).

This is because a depletion layer generated in the drift layer 2 can easily spread in the lateral direction along the $P^+$ layer 3 because of respective linking portions between the p-type semiconductor layers 3 and between the p-conductive type base layers 4. As a result, even when the impurity concentrations of the n-type semiconductor layer 2 and the n-type semiconductor well region 20 are designed to be higher than conventional MOSFETs, the distances can be increased between the p-type semiconductor layers 3 and between the p-conductive type base layers 4 to make the ON-resistance smaller while the element breakdown voltage is sufficiently maintained because of the design facilitating the lateral spread of the depletion layer along the $P^+$ layer 3.

If the base layer 4 of the present invention is formed by the epitaxial growth method, the base layer 4 can be made flat almost without surface roughness and therefore, the mobility of a MOSFET portion on the surface becomes extremely large. As a result, the ON-resistance can be made further smaller.

If the semiconductor material is silicon carbide, a crystallographic plane index of the n-type semiconductor substrate 1 can be set to an arbitrary angle greater than or equal to 0 degrees and less than or equal to 10 degrees relative to a plane parallel to (000-1), or a crystallographic plane index of the n-type semiconductor substrate 1 can be set to an arbitrary angle greater than or equal to 0 degrees and less than or equal to 10 degrees relative to a plane parallel to (0001), from a relationship between an off-angle and flatness of an epitaxial layer, to sufficiently reduce an off-angle and make a step sufficiently small and therefore, excellent roughness is achieved without deteriorating the mobility. Thus, since interface state density can be reduced at the interface between the gate oxide film and the semiconductor, the mobility of the MOSFET portion can further be improved. As a result, the ON-resistance can be made extremely small.

Because of the structure in which an electric field is hardly applied to the gate oxide film while sufficient breakdown voltage is retained regardless of crystal plane orientation of the substrate as exemplified by the (0001) plane system and the (000-1) plane system, the vertical SiC-MOSFET and the IGBT can be configured with low ON-resistance and a high breakdown capability such that high-speed switching can be realized.

According to the fabrication method of the device of the present invention, the respective $p^+$ type semiconductor layers 3 are formed on the n-type semiconductor layer 2 acting as the drift layer, facing the respective source regions, while the p-conductive type base layers 4 are formed on the $p^+$ type semiconductor layers 3, facing the layers 3, such that the respective joining portions are integrally formed between the $p^+$ type semiconductor layers 3 and between the p-conductive type base layers 4 and therefore, the joining portions can advantageously be laminated and formed at the same time when the respective layers are laminated, and the respective joining portions can be formed in a simple lamination procedure.

Since the channel region 18 is formed as the N-well region having the $N^-$ epitaxial layer 2 and the N-counter layer 5, even when the N-counter layer 5 can only be formed thinly, the channel region 18 is made thick overall and therefore, the electric field applied to the gate oxide film can be reduced.

Since the semiconductor material with a band gap of 2.2 eV or higher is used, all the SiCs with a band gap of 2.2 eV or higher are available, including 2H-SiC, 3C-SiC, 4H-SiC, and 6H-SiC having band gaps of 3.33 eV, 2.23 eV, 3.26 eV, and 2.93 eV, respectively, for example. The band gap of SiC can be identified by specifying 2.2 eV or higher as compared to 1.12 of Si. By using such a semiconductor material, the semiconductor device can have a wide energy gap and thermally stable characteristics. The semiconductor device can have low ON-resistance without destruction of gate oxide films or degradation of reliability even when high voltage is applied. Using such a semiconductor material produces an effect that a fabrication method specific to this material can be applied.

BRIEF DESCRIPTION OF DRAWINGS

FIGS. 1A, 1B, and 1C are diagrams of an SiC-MOSFET in a first embodiment (gate electrode and oxide film omitted);

FIG. 1D is plane view of gate electrode;

FIG. 3 depicts a fabrication method of a vertical planar gate MOSFET described in the first embodiment of the present invention (in case of P+ substrate of IGBT);

FIGS. 4A, 4B, and 4C are diagrams of the SiC-MOSFET in a third embodiment of the present invention;

FIGS. 5A, 5B, 5C, 5D, and 5E are explanatory diagrams of a well blocked state of the SiC-MOSFET in the third embodiment of the present invention;

FIG. 11 depicts a table of respective characteristics of first to five embodiments of the present invention as well as conventional elements;

FIG. 12 is a cross-sectional view of a conventional MOSFET;

FIG. 13 is a diagram depicting an off state of an SiC-MOSFET in a conventional example.

BEST MODE(S) FOR CARRYING OUT THE INVENTION

Embodiments of the present invention will be described with reference to the accompanying drawings.

First Embodiment

Figure 2A:
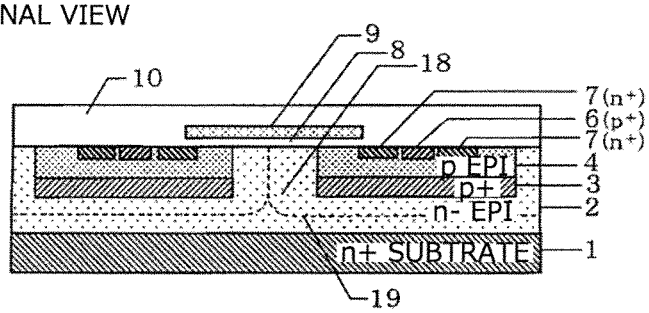
FIGS. 2A and 2B are diagrams for explaining a function of a joining portion.
Figure 2B:
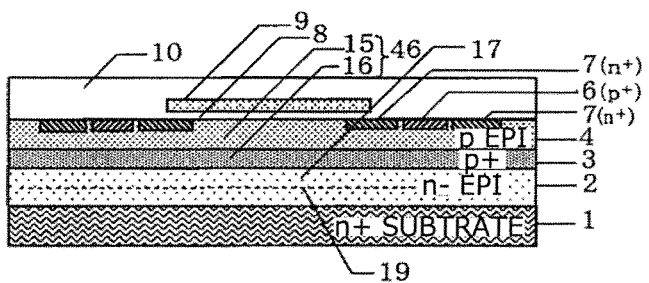

A first embodiment of the present invention will be described with reference to FIGS. 1A, 1B, 1C, and 1D. FIG. 1A is a cross-sectional view taken along a cut line E-F of FIG. 1B or FIG. 1C and is a plane view of a state in which an upper side from a gate oxide film is removed. FIG. 1B is a cross-sectional view taken along a cut line A-B of FIG. 1A. FIG. 1C is a cross-sectional view taken along a cut line C-D of FIG. 1A. FIG. 1D is a plane view of a gate electrode corresponding to FIG. 1A. FIGS. 2A and 2B are diagrams for explaining a function of a joining portion.

In the description of this embodiment, a vertical planar gate MOSFET is described as a MOSFET with an element breakdown voltage of 1200 V formed by using silicon carbide as a semiconductor material.

The first example Of FIGS. 1A, 1B, 1C, and 1D represents the case of a hexagonal cell pattern.

A vertical high-voltage semiconductor device of FIGS. 1A, 1B, 1C, and 1D, or particularly a vertical SiC-MOSFET, is made up of an $n^+$ type semiconductor 1, an $n^-$ type epitaxial layer 2 that is a drift layer epitaxially grown on the semiconductor substrate 1, a $P^+$ type semiconductor layer 3 selectively formed in the $n^-$ type epitaxial layer 2, a $p^-$ type semiconductor layer 4 epitaxially grown on a surface of the $P^+$ type semiconductor layer 3, an $n^+$ type source region 7 selectively formed in a surface layer of the $p^-$ type semiconductor layer 4, an n-type well region 20 formed to penetrate the $p^-$ type semiconductor layer 4 from the surface to the n-type epitaxial layer 2 layer, and a gate electrode 9 formed via a gate insulating film 8 on a surface of the p-type semiconductor layer 4 interposed between the n-type source region 7 and the n-type well region 20. The n-type well region 20 has an N-counter layer 5 and the $n^-$ type epitaxial layer 2 and acts as a channel region 18. A region 6 acts as a contact auxiliary layer. A region 10 is an interlayer insulating film. A region 17 is a linking-portion lower region in the $n^-$ epitaxial layer 2.

A source electrode (not depicted) is disposed on the first-conductivity-type source region 7 and the contact auxiliary layer 6. A drain electrode (not depicted) is disposed on the back surface of the semiconductor substrate 1.

A joining portion 46 has a joining portion 15 of the $p^-$ epitaxial layer 4 and a joining portion 16 of the $P^+$ layer 3 of FIG. 1C and is disposed immediately beneath the gate insulating film 8 and the gate electrode 9.

The joining portion 46 makes up a unit ensuring the spread of a depletion layer without a void space so as not to leave a portion of a well not closed by the depletion layer when the depletion layer completely spreads in the channel portion of the well, includes a point that is farthest and equidistant from the centers of all the source regions facing each other and that is closest and equidistant from end portions farthest from the centers of the source regions (a gap of outlines of depletion layers) in a plane in a direction along a substrate surface (in the planar view), has the joining portion 16 of the $P^+$ layer 3 (second-conductivity-type region for protecting the gate oxide film) and the joining portion 15 of the $p^-$ epitaxial layer 4 (base region), and is disposed integrally with the respective layers.

The joining portion is configured on the basis of a configuration of the source region. In cell electrode (source electrode), an outer shape of a surface along a substrate surface is formed into an electrode shape that is the same shape as, or a similar reduced shape of, an outer shape of the surface of the source region. In particular, the outer shape of the cell electrode (source electrode) is preferably formed into the similar reduced shape slightly smaller than the outer shape of the source region.

In the case of a hexagonal cell pattern, the joining portions are integrally disposed in the second-conductivity-type region 3 and the base region 4 so as to include a point that is farthest and equidistant from the centers of all the source regions facing each other and that is closest and equidistant from end portions farthest from the centers of the source regions (a gap of outlines of depletion layers) in the planar view.

As depicted in FIG. 2A, when a well is blocked by the depletion layer, an outline 19 of the depletion layer spreads through a channel region 18 to the gate insulating film 8 until the channel region 18 of the well is completely blocked by the depletion layer 19 extending from the P+ layer 3 to the channel region 18. In this case, since the joining portion 46 is continuously formed in the longitudinal direction of the P+ layer 3 as depicted in FIG. 2B and therefore, a space from the drift layer 2 immediately beneath the gate oxide film 8 and the gate electrode 9 to the oxide film 8 is isolated, the outline 19 of the depletion layer 19 does not come closer to the oxide film 8 and no gap is generated in the outline of the depletion layer.

Figure 14A:
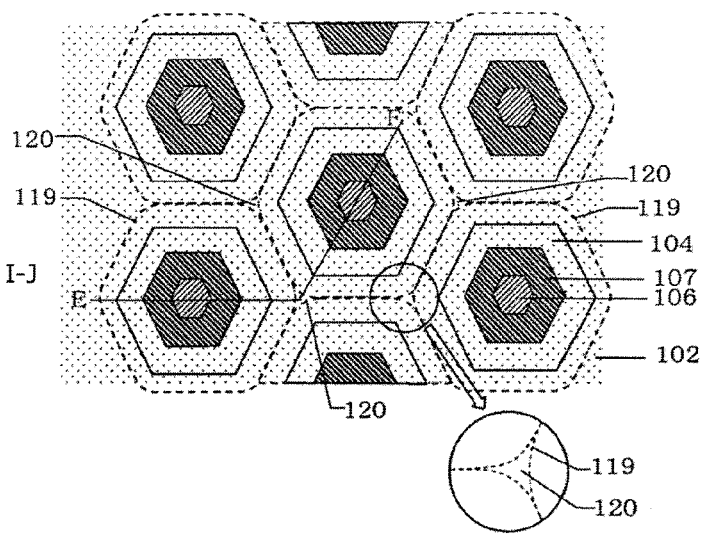
FIGS. 14A and 14B are explanatory views when the joining portion is omitted from the first embodiment of the present invention.
Figure 14B:
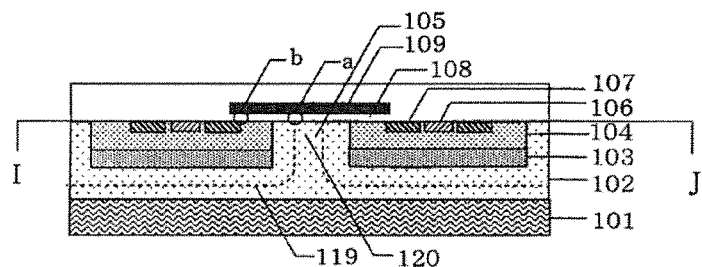

Functions/effects of the joining portion 46 will be described with reference to FIGS. 14A and 14B. FIGS. 14A and 14B are explanatory views when the joining portion 46 is omitted from the first embodiment depicted in FIGS. 1A, 1B, 1C, 1D, 2A and 2B. FIG. 14A is a plane view taken along a cut line I-J of FIG. 14B, and FIG. 14B is a cross section view taken along a cut line E-F of FIG. 14A. Reference numerals 101 to 109 and 119 are acquired by adding 100 to reference numerals of the corresponding constituent elements of the first example.

While a well is blocked by depletion layers, the depletion layers are generally formed as the outlines 119 indicated by dotted lines. On a line connecting center points of adjacent hexagonal cell patterns through a straight line (see FIGS. 2A and 2B), the outlines 119 of the mutually facing depletion layers are formed in contact with each other such that the well is completely blocked. However, on a line connecting center points of adjacent hexagonal cell patterns as indicated by a line segment E-F, a gap 120 of the outlines of the depletion layers is formed because the outlines 119 of the depletion layers do not come into contact with each other as depicted in an enlarged view surrounded by a circle mark in FIG. 14A. If the outlines 119 of the depletion layers come into contact with each other, no drift region is formed and current is prevented from flowing. Contrarily, if the outlines 119 of the depletion layers do not come into contact with each other in some locations, drift regions are formed, facilitating a current flow.

The center of the gap 120 of the outlines of the depletion layers is a position at which lengths from the center points of the three adjacent hexagonal cell patterns are equal.

In this example, the gap 120 of the outlines of the depletion layers is substantially triangular in the plane view of FIG. 14A, substantially parallel in the cross-sectional view of FIG. 14B, and generally has a substantially triangle pole shape. A shape of the gap of the outlines of the depletion layers differs depending on a cell pattern.

The gap 120 of the outlines of the depletion layers is formed in a cross-sectional view as depicted in the cross-sectional view of FIG. 14B.

Therefore, an electric field may concentrate between a portion a of a circle mark at which the outline 119 of the depletion layer comes into contact with a gate insulating film 108 on the gate electrode 109 side and a portion b of a circle mark at which an n-type source region 107 comes into contact with the gate insulating film 108 on the gate electrode 109 side, resulting in dielectric breakdown of the gate oxide film 108.

The joining portion of the present invention can prevent destruction of the gate oxide film due to the electric field concentration.

FIG. 3 depicts a fabrication method of the vertical planar gate MOSFET described in the first embodiment of the present invention.

FIG. 3(a) includes steps of the left column of FIG. 3 and is a cross-sectional view of steps of manufacturing a portion without the P+ layer 3 connected thereto. FIG. 3(b) includes steps of the right column of FIG. 3 and is a cross-sectional view of steps of manufacturing a portion with the P+ layer 3 connected thereto. The steps consist of: step 1 (a1, b1), N− epitaxial (the epitaxial layer 2) growth; step 2 (a2, b2), implantation of the P+ layer 3 (ion implantation); step 3 (a3, b3), epitaxial growth of the P-layer 4 (epitaxial growth of the base region 4); step 4 (a4), inversion of the N-layer 5 (ion implantation); step 5 (a5, b5), formation of the N+ region 7 (source region) and the P+ layer 6 (contact auxiliary layer for the base region 4); step 6 (a6, b6), formation of the gate oxide film 8 and the gate electrode 9; and step 7 (a7, b7), formation of the interlayer insulating film 10 and the electrodes 12 and 13.

Step 1 (a1, b1):

First, the n-type SiC semiconductor substrate 1 is prepared. In this example, the semiconductor substrate 1 is the low-resistance SiC semiconductor 1 having about $2 \times 10^{19}$ cm$^{-3}$ of nitrogen as impurities. The crystallographic plane index of the n-type semiconductor substrate 1 indicates a plane tilted by 4 degrees relative to (000-1), and the n-type SiC layer 2 having about $1.8 \times 10^{16}$ cm$^{-3}$ of nitrogen is epitaxially grown by 10 μm on the plane.

Step 2 (a2, b2):

The P+ layer 3 is formed with a width of 13 μm and a depth of 0.5 μm by the ion implantation method on the layer 2. Aluminum ions are used in this case. A dosage is set so as to achieve an impurity concentration of $1.0*10^{18}$ cm$^{-3}$. As described later, respective portions of the P+ layer 3 are connected to each other (see FIG. 1C). In other words, the P+ layer 3 and the P− layer 4 are continuously formed into respectively linked shapes as depicted in FIG. 1C without forming the N-counter layer 5 and the N-well region 20 as depicted in FIG. 1B (see step (b2)). This linked portion acts as a joining portion described later. In the other portions, the P+ layer 3 of a predetermined shape is selectively formed on the layer 2 by the ion implantation method (see step (b2)).

Although the element is formed in the hexagonal cell pattern in this embodiment, a rectangular cell pattern etc. are available without problem. A distance between the unconnected P+ layers 3 depicted in FIG. 1B is set to 2 μm.

Step 3 (a3, b3):

The P-base layer 4 is formed with a thickness of 0.5 μm on the p+ layer 3 and the n-type layer 2 by the epitaxial growth method. The impurities in this case are aluminum and an impurity concentration is set to $2.0*10^{16}$ cm$^{-3}$.

Step 4 (a4):

Subsequently, nitrogen ions are selectively implanted at $5.0*10^{16}$ cm$^{-3}$ to 1.5 μm in depth and 2.0 μm in width to form the N-counter layer 5 such that the linked portions of the P-base layer 4 and the P+ layer 3 (acting as the joining portion; see step b(3)) are partially left.

Step 5 (a5, b5):

The n+ source layer 7 and the P+ contact layer 6 are selectively formed in the P-base layer 4 by ion implantation.

Step 6 (a6, b6):

Activation annealing is then performed. A heat treatment temperature and time are 1620 degrees C. and two minutes, respectively. Subsequently, the gate oxidation film 8 is formed with a thickness of 100 nm by thermal oxidation and is annealed at 1000 degrees C. in a hydrogen atmosphere. A polycrystalline silicon layer doped with phosphorus is formed as the gate electrode 9 and patterned.

Step S7 (a7, b7):

A 1.0-μm-thick film of phosphorus glass is formed as the interlayer insulating film 10 on the gate electrode 9 and a source electrode (not depicted) disposed in contact with the n+ source layer 7 and the layer 6 and, after patterning and heat treatment, a film of aluminum 11 having 1% silicon is formed to a thickness of 5 μm on the surface by the sputtering method. A film of nickel 12 is formed on the back surface of the element and, after heat treatment at 970 degrees C., a film of Ti/Ni/Au 13 is formed. The nickel film layer and the Ti/Ni/Au film layer make up a drain electrode. A protection film 14 is lastly added to the surface to complete the element.

In the method, parameters can be changed as needed in terms of film thickness, temperature, impurity concentration, a type of additives, etc., as long as a desired semiconductor element is created by executing a series of procedures.

Measurement results of electrical properties of SiC-MOSFETs of the present invention created in this way are described in Table 1 of FIG. 11. FIG. 11 depicts a table of respective characteristics of first to five embodiments of the present invention as well as an SiC-MOSFET and an Si-IGBT of conventional techniques.

A die size is 3 mm square with an active area of 5.27 mm² and rated current is 25 A. In the case of the first embodiment, the ON-resistance (RonA) is a sufficiently low value of 2.85 mΩcm² and the initial element breakdown voltage is 1452 V, which is sufficiently good characteristic for a 1200-V element. When measurement was performed for the SiC-MOSFET of an comparison example created without connection between the P-base layer 204 and a P+ layer 203 for comparison, although the ON-resistance was a comparable sufficiently low value of 2.8 mΩcm², the gate oxide film was destructed when 880 V was applied between the source and the drain. This reveals that the element of the present invention has extremely low ON-resistance while maintaining sufficient element breakdown voltage.

Figure 6:
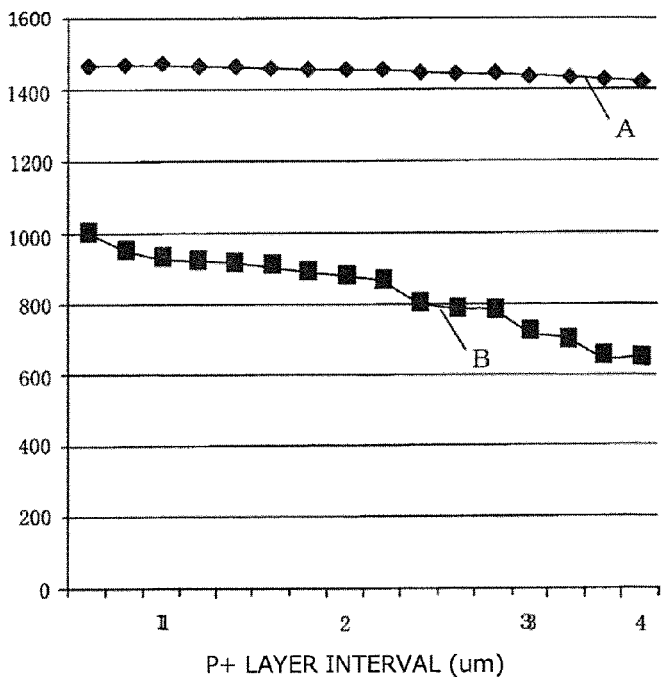
FIG. 6 is a P+ layer interval/element breakdown voltage characteristic diagram of the first embodiment of the present invention and a conventional SiC-MOSFET and is a comparative evaluation result.

FIG. 6 is a P+ layer interval/element breakdown voltage characteristic diagram of the first embodiment of the present invention and a conventional SiC-MOSFET and is a comparative evaluation result.

FIG. 6 depicts actual measurement results when an element breakdown voltage and an N-counter layer (P+ layer) width are changed in the SiC-MOSFET of the first embodiment of the present invention and an SiC-MOSFET without mutual connections between the P-base layers 204 and between the P+ layers 203 in the SiC-MOSFET of the first embodiment of the present invention. The horizontal axis indicates a P+ layer interval (μm) and the vertical axis indicates an element breakdown voltage (V).

The characteristics of FIG. 6 are actual measurement results when an element breakdown voltage and an N-counter layer (P+ layer) width are changed in the SiC-MOSFET (A) of the first embodiment of the present invention and an SiC-MOSFET (B) created for comparison without mutual connections between the P-base layers 204 and between the P+ layers 203. Concentration and thickness of each layer of the elements are as described above.

The actual measurement results of the P+ layer interval/element breakdown voltage characteristics are exemplified in the following table.

TABLE 1

| | element breakdown voltage (V) | |
|---|---|---|
| P+ layer interval (μm) | present invention (A) | conventional technique (B) |
| 0.5 | 1466 | 1000 |
| 1.0 | 1465 | 925 |
| 2.0 | 1451 | 878 |
| 3.0 | 1439 | 725 |
| 4.0 | 1424 | 647 |

As a result, it can be seen that the first embodiment of the present invention realizes high breakdown voltage characteristic of 1400 V or higher, which is sufficient breakdown voltage for a 1200-V device. The ON-resistance in this case is the same in the both conditions and it is found that creating a cell under a gate pad is effective for reducing ON-resistance because an effective area in an element increases. It is found that, to satisfy the high breakdown voltage characteristic of 1400 V or higher equivalent to the first embodiment of the present invention in the SiC-MOSFET used for comparison, a mutual distance between the P+ layers 203 must be less than or equal to 1.0 μm while the concentration of the N-counter layer must be reduced to one fifth so as not to exceed the breakdown electric field of the gate oxide film. The ON-resistance in this case indicates an extremely high value of 10.8 mΩcm². Therefore, the present invention can improve the ON-resistance and the element breakdown voltage characteristic at the same time.

A short circuit capability test was performed. In this test, a source voltage is directly applied between the source and the drain and a voltage Vg=20 V is applied to the gate electrode in this state to evaluate a time until destruction in μsec. The source voltage is Vcc (Vds)=800 V and a measurement temperature (Tj) is 175 degrees C. A schematic of measurement waveforms is depicted in FIG. 7.

Figure 7:
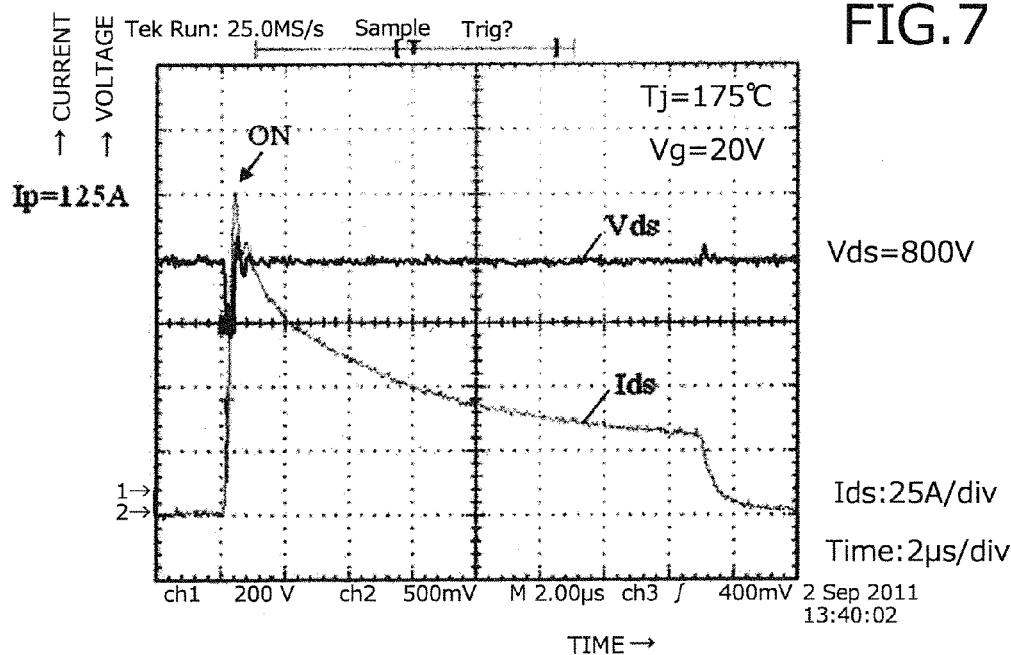
FIG. 7 is a characteristic diagram of a measurement result of a short circuit capability test of the SiC-MOSFET in the first embodiment of the present invention.

FIG. 7 is a characteristic diagram of a measurement result of the short circuit capability test of the SiC-MOSFET in the first embodiment of the present invention. The horizontal axis of FIG. 7 indicates time (μs) and the vertical axis indicates voltage (V) and current (A). On the characteristic diagram, a large amount of electric current is applied at an ON-position.

As a result, the element was not destructed even when the element conducted the maximum current of 125 A (Ip), which is five times larger than the element rating, and was not destructed even after 15 μsec, exhibiting sufficient characteristics.

Figure 8:
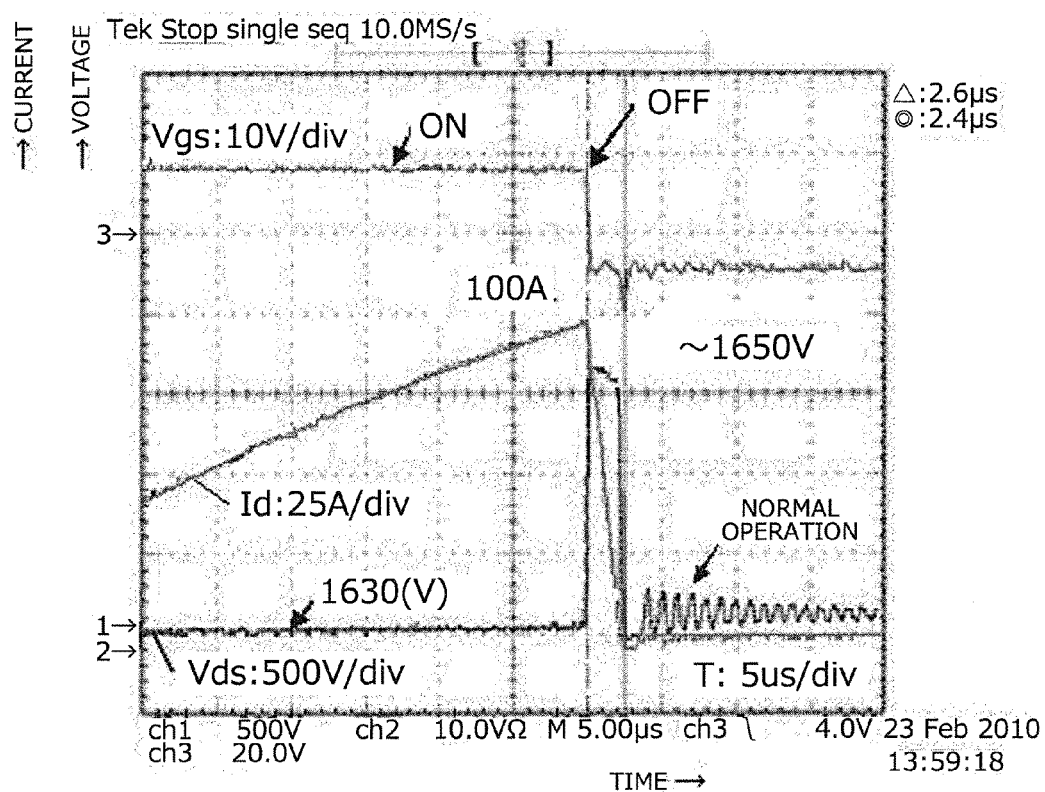
FIG. 8 is a characteristic diagram of a turn-off breakdown capability evaluation test of the SiC-MOSFET in the first embodiment of the present invention.

FIG. 8 is a characteristic diagram of a turn-off breakdown capability evaluation test of the SiC-MOSFET in the first embodiment of the present invention. The horizontal axis of FIG. 8 indicates time (μs) and the vertical axis indicates voltage (V) and current (A).

When the turn-off capability was evaluated, a source-drain voltage Vds was clamped at 1630 V (Vdsclamp of FIG. 8) and it was confirmed that the SiC-MOSFET could be turned off at 100 A (four times larger than rated current) at 150 degrees C. without destruction.

Therefore, the element of the present invention can be considered as an element realizing low ON-resistance and having extremely large short circuit capability and turn-off capability. When the capabilities are evaluated for a conventional SiC-MOSFET created for comparison, the results of both the short circuit capability and the turn-off capability were quite inferior to the element of the first embodiment of the present invention because of insufficient element breakdown voltage (see, Table 1 of FIG. 11).

When films were formed in the same way on the planes tilted by an arbitrary angle greater than or equal to 0 degrees and less than or equal to 10 degrees, for example, 0, 2, 8, and 10 degrees, relative to (000-1) in terms of the crystallographic plane index of the n-type semiconductor substrate 1 and the element evaluation was performed for the created elements, the characteristics were almost unchanged and were favorable. The same favorable effects were confirmed when an element was experimentally produced by using GaN.

Figure 9A:
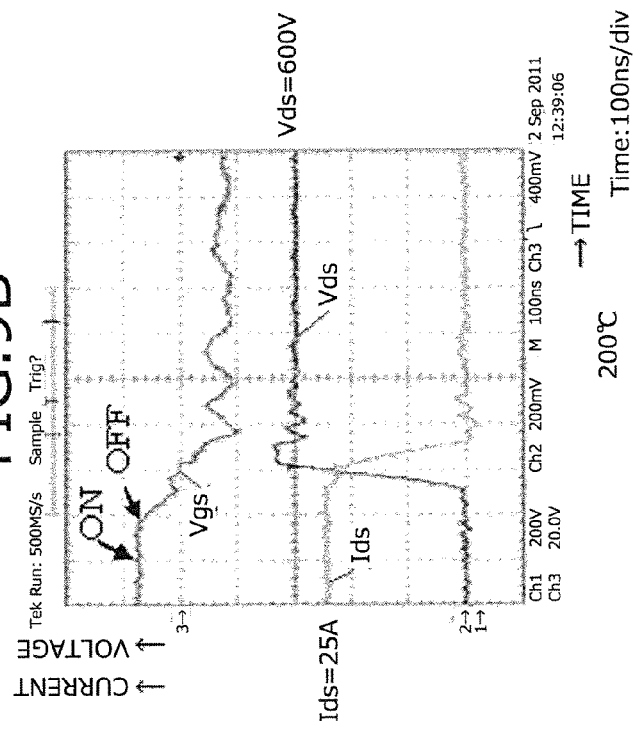
FIGS. 9A and 9B are turn-off switching waveform diagrams of the SiC-MOSFET in the first embodiment of the present invention.
Figure 9B:
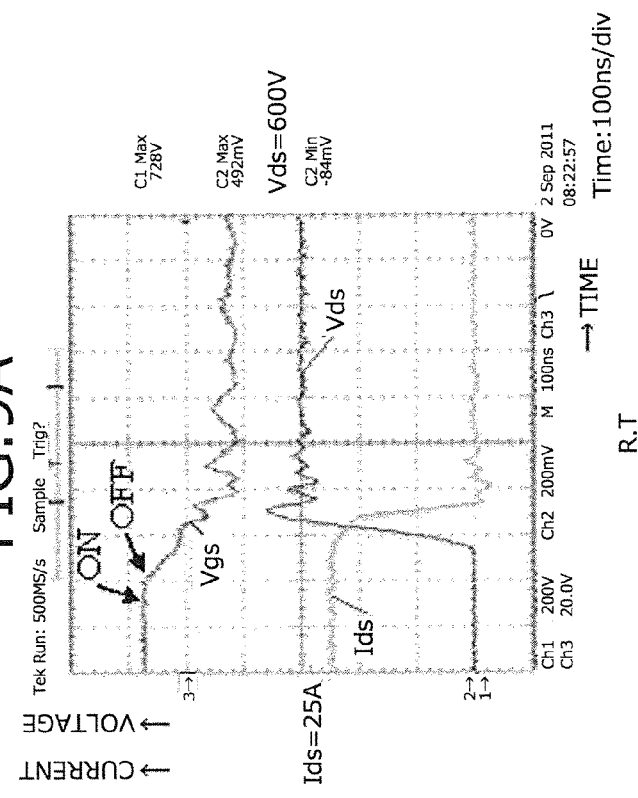

FIGS. 9A and 9B are turn-off switching waveform diagrams of the SiC-MOSFET in the first embodiment of the present invention. FIG. 9A depicts characteristics of a drain-source voltage Vds, a gate-source voltage Vgs, and a drain-source current Ids when a measurement temperature is R.T (room temperature) with the horizontal axis indicative of time and the vertical axis indicative of voltage and current. FIG. 9B depicts characteristics of the drain-source voltage Vds, the gate-source voltage Vgs, and the drain-source current Ids when a measurement temperature is 200 degrees C. with the horizontal axis indicative of time and the vertical axis indicative of voltage and current.

FIGS. 9A and 9B depict a state after Vgs is switched from an ON-state to an OFF-state. Ids is switched from 25 A to 0A and Vds is switched from 0 V to 600 V. After the switching, the voltages promptly converge in about 100 ns.

The characteristics of FIGS. 9A and 9B are favorable as a semiconductor element in terms of the breakdown voltage and the resistance value.

Figure 10A:
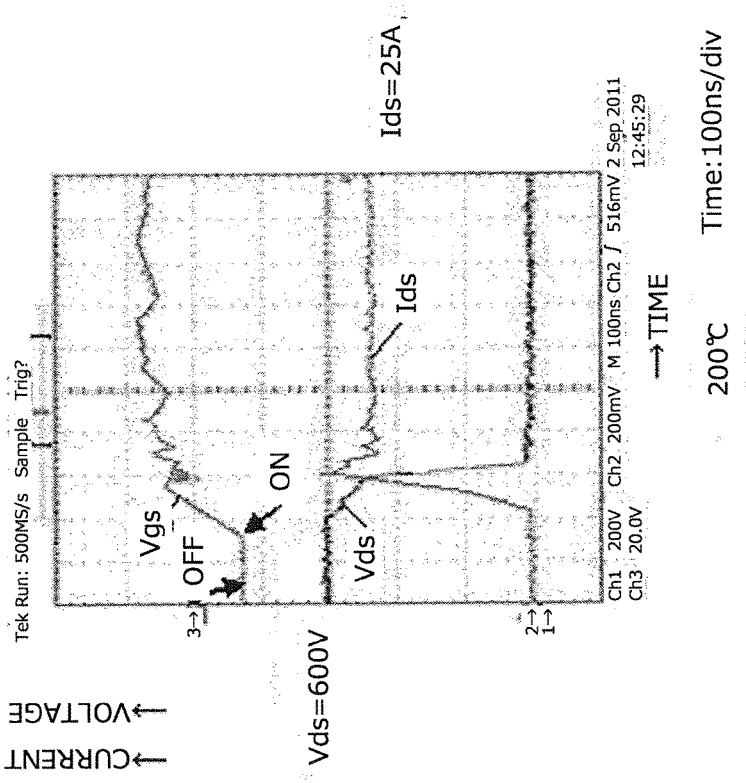
FIGS. 10A and 10B are turn-on switching waveform diagrams of the SiC-MOSFET in the first embodiment of the present invention.
Figure 10B:
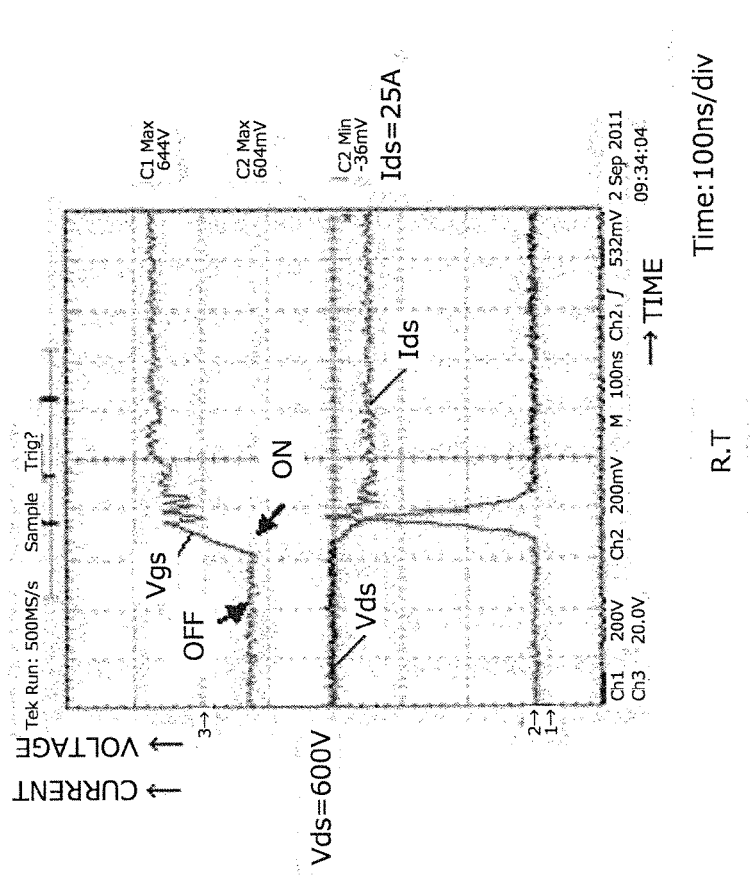

FIGS. 10A and 10B are turn-on switching waveform diagrams of the SiC-MOSFET in the first embodiment of the present invention.

FIG. 10A depicts characteristics of the drain-source voltage Vds, the gate-source voltage Vgs, and the drain-source current Ids when a measurement temperature is R.T (room temperature) with the horizontal axis indicative of time and the vertical axis indicative of voltage and current. FIG. 10B depicts characteristics of the drain-source voltage Vds, the gate-source voltage Vgs, and the drain-source current Ids when a measurement temperature is 200 degrees C. with the horizontal axis indicative of time and the vertical axis indicative of voltage and current.

FIGS. 10A and 10B depict a state after Vgs is switched from an OFF-state to an ON-state. Ids is switched from 0 A to 25A and Vds is switched from 600 V to 0 V. After the switching, the voltages promptly converge in about 100 ns.

The characteristics depicted in FIGS. 10A and 10B are favorable as a semiconductor element in terms of the breakdown voltage and the resistance value.

Second Embodiment

A vertical SiC-MOSFET was produced with specifications of 1200 V and 25 A at the same fabrication steps as the first embodiment. However, in this embodiment, the crystallographic plane index of the n-type semiconductor substrate 1 indicates a plane tilted by 4 degrees relative to (0001), and the n-type SiC layer 202 having about $1.8 \times 10^{16}$ cm$^{-3}$ of nitrogen was epitaxially grown by 10 μm on the plane. The other steps and cell structure are completely the same.

The electrical properties evaluation results of the produced element are depicted as the second embodiment in Table 1 of FIG. 11. Although the ON-resistance increases to 4.27 mΩcm$^2$ by 50% as compared to the embodiment described above, it can be seen that the ON-resistance characteristic is sufficiently lower as compared to normal SiC-MOSFETs.

When films were formed in the same way on planes tilted by an arbitrary angle greater than or equal to 0 degrees and less than or equal to 10 degrees designed in a stripe cell pattern, for example, 0, 2, 8, and 10 degrees, relative to (0001) in terms of the crystallographic plane index of the n-type semiconductor substrate 201 and the element evaluation was performed for the created elements, the characteristics were almost unchanged and were favorable.

Third Embodiment

FIG. 4A, 4B, and 4C is a diagram of arrangement of the P+ layer 3 and a cell of the SiC-MOSFET in the third embodiment of the present invention. FIG. 4A is a plane view taken along a cut line E-F of FIG. 4B or FIG. 4C (however, the upper side from the gate oxide film is not depicted). FIG. 4B is a cross-sectional view taken along a cut line A-B of FIG. 4A and FIG. 4C is a cross-sectional view taken along a cut line C-D of FIG. 4A.

FIG. 5A, 5B, 5C, 5D, and 5E is an explanatory diagram of a well blocked state of the SiC-MOSFET in the third embodiment of the present invention. FIG. 5A is a plane view taken along a cut line E-F of FIG. 5B or FIG. 5C; FIG. 5B is a cross-sectional view taken along a cut line A-B of FIG. 5A; FIG. 5C is a cross-sectional view taken along a cut line C-D of FIG. 5A; FIG. 5D is a cross-sectional view taken along a cut line G-H of FIG. 5A; and FIG. 5E is a cross-sectional view taken along a cut line G-H of FIG. 5A without a joining portion.

A vertical SiC-MOSFET in a stripe cell pattern of FIGS. 4A, 4B, and 4C is made up of: an n$^+$ type semiconductor substrate 21; an n$^-$ type epitaxial layer 22 that is a drift layer epitaxially grown on the semiconductor substrate 21; a P$^+$ type semiconductor layer 23 selectively formed in the n$^-$ type epitaxial layer 22; an n$^+$ type source region 27 selectively formed in a surface layer of a p$^-$ type semiconductor layer 24 after the p$^-$ type semiconductor layer 24 is epitaxially grown on a surface of the P$^+$ type semiconductor layer 23; an n-type well region 44 formed to penetrate the p$^-$ type semiconductor layer 4 from the surface to the n-type epitaxial layer 22; and a gate electrode 29 formed via a gate insulating film 28 on a surface of the p-type semiconductor layer 24 interposed between the n-type source region 27 and the n-type well region 44. A region 26 acts as a contact auxiliary layer for a base region. Reference numeral 30 denotes an interlayer insulating film. A source electrode (not depicted) is disposed on the region 27 and the region 26. A drain electrode (not depicted) is disposed on the back surface of the semiconductor substrate 21.

The n-type well region 44 has an N-counter layer 25 and the n$^-$ type epitaxial layer 22 and makes up a channel region 38. The n-type well region 44 is provided with a divided region 41 that is the same as the P$^+$ type semiconductor layer 23 and a divided region 40 that is the same as the p$^-$ type semiconductor layer 24. The region 26 acts as a contact auxiliary layer for a base region. Reference numeral 30 denotes an interlayer insulating film. A region 37 is a linking-portion lower region in the n$^-$ epitaxial layer 2.

A joining portion 45 has a joining portion 35 of the p$^-$ epitaxial layer 24 and a joining portion 36 of the P$^+$ layer 3 of FIG. 4C and is disposed immediately beneath the gate insulating film 28 and the gate electrode 29. Reference numeral 42 denotes a unit cell pattern. Practically, the required number of such cell patterns is arranged on a plane.

The joining portion 45 makes up a unit ensuring the spread of a depletion layer without a void space so as not to leave a portion of a well not closed by the depletion layer when the depletion layer completely spreads in the channel portion of the well, includes a point that is farthest and equidistant from the centers of all the source regions facing each other and that is closest and equidistant from end portions farthest from the centers of the source regions in a plane in a direction along a substrate surface (in the planar view), has the joining portion 36 of the P⁺ layer 3 (second-conductivity-type region for protecting the gate oxide film) and the joining portion 35 of the p⁻ epitaxial layer 24 (base region), and is disposed integrally with the respective portions thereof.

The joining portion is configured on the basis of a configuration of the source region. In cell electrode (source electrode), an outer shape of a surface along a substrate surface is formed into an electrode shape that is the same shape as, or a similar reduced shape of, an outer shape of the surface of the source region. In particular, the outer shape of the cell electrode (source electrode) is preferably formed into the similar reduced shape slightly smaller than the outer shape of the source region.

In the case of a stripe cell pattern, the joining portion is integrally disposed in the second-conductivity-type region and the base region so as to include a point that is farthest and equidistant from the centers of all the source regions 27 facing each other and that is closest and equidistant from end portions farthest from the centers of the source regions in the planar view.

Although the position of the joining portion 45 is not directly above a gap 43 of outlines of depletion layers 39 in the third embodiment 3, the joining portion 45 can push the gap of the outlines of the depletion layers 39 away from immediately beneath the gate electrode 29 outward to a position of a sufficient distance even in this structure such that the field strength is attenuated and therefore, this eliminates the problem of dielectric breakdown due to the electric field concentration on the gate oxide film 28.

As depicted in FIG. 5B, by applying the unit ensuring the spread of the depletion layer without a void space so as not to leave a portion of the well not closed by the depletion layer when the depletion layer completely spreads in the channel portion of the well, the outline 19 of the depletion layer spreads through the channel region 38 to the gate insulating film 28 until the channel region 38 of the well is completely blocked by the outline 39 of the depletion layer extending from the P⁺ layer 23 to the channel region 38. In this case, since the joining portion 45 is continuously formed in the longitudinal direction of the P⁺ layer 23 as depicted in FIG. 5C and therefore, since a space from the drift layer 22 to the oxide film 28 is isolated immediately beneath the gate oxide film 28 and the gate electrode 29, the outline 39 of the depletion layer is suppressed by the linking-portion lower region 37 in the n⁻ epitaxial layer 22 and does not extend to the gate oxide film 28.

Functions/effects of the joining portion 45 will be described with reference to FIG. 5A, 5B, 5C, 5D, and 5E. FIG. 5E is an explanatory view when the joining portion 45 characterizing the present invention is omitted from the third embodiment depicted in FIG. 4A, 4B, and 4C.

While a well is blocked by a depletion layer, the depletion layer is generally formed as the outline 39 indicated by a dotted line. On a line connecting center points of facing stripe cells through a straight line (see FIG. 5A), the outlines 39 of the mutually facing depletion layers are formed in contact with each other such that the well is completely blocked (see FIG. 5A). However, on a line connecting center points of facing stripe cells as indicated by a line segment G-H, a gap 43 of the outlines of the depletion layers is formed by the outlines 39 of the depletion layers coming into contact with the gate oxide film 28, as indicated by portions surrounded by a circle mark c and a circle mark d of FIG. 5E (gaps are exemplarily illustrated with hatched lines in see FIG. 5A. As a result, an electric field may concentrate on the oxide layer 28 through the gap 43 of the outlines of the depletion layers, resulting in dielectric breakdown.

In this regard, in the vertical SiC-MOSFET in the stripe cell pattern of the present invention, as depicted in FIG. 5D, the joining portion 45 has the joining portion 36 of the P⁺ layer 23 (second-conductivity-type region for protecting the gate oxide film) and the joining portion 35 of the p⁻ epitaxial layer 24 (base region) and is disposed across both ends of facing stripe cell regions (in this case, the source regions 27) and therefore, as depicted in FIG. 5D, the outlines 39 of the depletion layers are biased and bent away from the gate oxide film 28 by the joining portion 45 as compared to the example depicted in FIG. 5E. Therefore, in the case of FIG. 5D, since the gap 43 of the outlines of the depletion layers has a longer distance to the gate oxide film 28 as compared to the case of FIG. 5E, the electric field concentration is alleviated and the dielectric strength is improved. In other words, since the joining portion 45 is disposed in the case of FIG. 5D, the outlines 39 of the depletion layers 39 can be restrained from coming closer to the gate oxide film 28. This action is attained even if the joining portion 45 is not continuously disposed in a stripe cell region (in this example, the source region 27) or is disposed only in the gap 43 of the outlines of the depletion layers.

As a result, because of the joining portion 45, the gap 43 of the outlines of the depletion layers formed by the outlines 39 of the depletion layers coming into contact with the gate oxide film 28 is not generated at a closer location that may cause dielectric breakdown due to electric field concentration as in the example without the joining portion 45 depicted in FIG. 5E, the breakdown voltage can be improved. In other words, although the position of the joining portion 45 is not directly above the gap 43 of the outlines of the depletion layers 39 in the third embodiment 3, the joining portion 45 can push the gap 43 of the outlines of the depletion layers 39 away from immediately beneath the gate electrode 29 outwards to a position of a sufficient distance even in this structure such that the field strength is attenuated and therefore, this eliminates the problem of dielectric breakdown due to the electric field concentration on the gate oxide film 28.

A fabrication method of the element of the third embodiment of the present invention will hereinafter be described.

The SiC-MOSFET of the present invention was produced with specifications of 1200 V and 25 A at the same fabrication steps as the first embodiment. The crystallographic plane index of the n-type semiconductor substrate 21 indicated a plane tilted by 4 degrees relative to (000-1), and the n-type SiC layer 22 having about $1.8 \times 10^{16}$ cm$^{-3}$ of nitrogen was epitaxially grown by 10 μm on the plane. The element was designed in the stripe cell pattern in the third embodiment. Therefore, the P⁺ layer 23 is disposed in a structure as depicted in FIGS. 4A, 4B, and 4C such that the P-base layer 24 and the P⁺ layer 23 are joined. The other steps are the same as the steps of the first embodiment.

The electrical properties evaluation results of the SiC-MOSFET designed in the stripe cell pattern of the present invention of FIGS. 4A, 4B, and 4C are depicted as the third embodiment in Table 1 of FIG. 11. Although the ON-resistance increases by 10% as compared to the embodiment described above, it can be seen that the ON-resistance and high breakdown voltage characteristics are sufficiently lower as compared to normal SiC-MOSFETs.

Fourth Embodiment

A fabrication method of the element of the fourth embodiment will be described with reference to FIG. 3.

First, the n-type SiC semiconductor substrate 1 is prepared. In this example, the semiconductor substrate 1 is the low-resistance SiC semiconductor 1 having about $2 \times 10^{19}$ cm$^{-3}$ of nitrogen as impurities. The crystallographic plane index of the n-type semiconductor substrate 1 indicates a plane tilted by 4 degrees relative to (000-1), and the n-type SiC layer 2 having about $1.8 \times 10^{16}$ cm$^{-3}$ of nitrogen is epitaxially grown by 10 μm on the plane. The P$^+$ layer 3 is formed thereon with a width of 13 μm and a thickness of 0.5 μm by the epitaxial method. Aluminum is used for impurity ions in this case. A dosage is set so as to achieve an impurity concentration of $1.0 \ast 10^{18}$ cm$^{-3}$. As is the case with the first embodiment, portions of the P$^+$ layer 3 are joined to each other (see FIG. 3(b2)).

Although the element is created in the hexagonal cell pattern in this embodiment, a rectangular cell pattern, etc. are possible without problem. The distance between the unconnected portions of the P$^+$ layer 3 is set to 2 μm (see FIG. 3(a)). The P-base layer 4 is then formed with a thickness of 0.5 μm on the P$^+$ layer 3 and the n-type layer 2 by the epitaxial growth method. The impurity in this case is aluminum and the impurity concentration is set to $2.0 \ast 10^{16}$ cm$^{-3}$. Subsequently, nitrogen ions are selectively implanted as the N-counter layer 5 such that the linked portions of the P-base layer 4 and the P$^+$ layer 3 are partially left so as not to allow a gap of an electric field to reach the gate oxide film 8, and the n$^+$ source layer 7 and the P+ contact layer 6 are selectively formed in the P-base layer 4. The concentration, thickness, and width of the counter layer 5 are the same as the first embodiment. Activation annealing is then performed. Heat treatment temperature at 1620 degrees C. for two minutes is performed.

Subsequently, the gate oxidation film 8 is formed with a thickness of 100 nm by thermal oxidation and is annealed at around 1000 degrees C. in a hydrogen atmosphere. A polycrystalline silicon layer doped with phosphorus is formed as the gate electrode 9 and after patterning and the formation of the source electrode (not depicted) on the layers 7 and 6, a 1.0-μm-thick film of phosphorus glass is formed as the interlayer insulating film 10. After patterning and heat treatment, a film of aluminum 11 having 1% silicon is formed to a thickness of 5 μm on the surface by the sputtering method. A film of the nickel 12 is formed on the back surface of the element and, after heat treatment at 970 degrees C., a film of Ti/Ni/Au 13 is formed. The protection film 14 is added to the surface to complete the element.

Measurement results of electrical properties of the SiC-MOSFET created in this way are described as the fourth embodiment in Table 1 of FIG. 11. A die size is 3 mm square with an active area of 5.27 mm$^2$ and rated current is 25 A. The ON-resistance (RonA) is a sufficiently low value of 2.90 mΩcm$^2$ and the initial element breakdown voltage is 1454 V, which is sufficiently good characteristic for a 1200-V element. When films were formed in the same way on planes tilted by an arbitrary angle greater than or equal to 0 degrees and less than or equal to 10 degrees, for example, 0, 2, 8, and 10 degrees, relative to (000-1) in terms of the crystallographic plane index of the n-type semiconductor substrate 1 and the fabricated elements were evaluated, the characteristics were almost unchanged and were favorable.

Fifth Embodiment

A MOSFET was produced with specifications of 1200 V and 25 A at the same fabrication steps as the fourth embodiment. However, in this embodiment, the crystallographic plane index of the n-type semiconductor substrate 1 indicated a plane tilted by 4 degrees relative to (0001), and the n-type SiC layer 2 having about $1.8 \times 10^{16}$ cm$^{-3}$ of nitrogen was epitaxially grown by 10 μm on the plane. The other steps are completely the same.

The electrical properties evaluation results of the produced element are described in Table 1 of FIG. 11. Although the ON-resistance increases to 4.40 mΩcm$^2$ by 50% as compared to the fourth embodiment, it can be seen that the ON-resistance characteristic is sufficiently lower as compared to normal SiC-MOSFETs.

When films were formed in the same way on planes tilted by an arbitrary angle greater than or equal to 0 degrees and less than or equal to 10 degrees, for example, 0, 2, 8, and 10 degrees, relative to (0001) in terms of the crystallographic plane index of the n-type semiconductor substrate 1 and the element evaluation was performed for the created elements, the characteristics were almost unchanged and were favorable.

As a result of switching loss evaluation of the SiC-MOSFETs created in the first to fourth embodiments, it is confirmed that both the turn-on and turn-off losses are reduced by as much as 60% or more as compared to an Si-IGBT of the same rating (1200V, 25 A) as depicted in FIG. 7.

Although not described in the embodiments, the present invention is obviously applicable to IGBTs using semiconductor substrates of conductive types different from MOSFETs.

In the case of IGBTs, in FIG. 3, the element has a configuration in which all the constituent elements are employed in the same way except that the substrate 1 is a P$^+$ substrate, and is manufactured by the fabrication method of FIG. 3. In the case of IGBTs, the first to fifth embodiments have a configuration in which the substrate 1 is a P$^+$ substrate. As a result, the desired objects and effects described above are produced.

EXPLANATIONS OF LETTERS OR NUMERALS

1 N$^+$ substrate/P$^+$ substrate
2 N$^-$ epitaxial layer (drift layer)
3 P$^+$ layer (second-conductivity-type region for protecting a gate oxide film)
4 p$^-$ epitaxial layer (base region)
5 N-counter layer
6 contact auxiliary layer for a (P$^+$) base region
7 (N$^+$) source region
8 gate oxide film
9 gate electrode (polycrystalline Si layer)
10 interlayer insulating film
11 Al film layer
12 Ni film layer
13 Ti/Ni/Au film layer
14 protection film
15 (P$^-$ epitaxial layer 4) joining portion
16 (P$^+$ layer 3) joining portion
17 (N$^-$ epitaxial layer 2) joining-portion lower portion
18 channel region
19 outline of a depletion layer
20 N-well layer
21 N$^+$ substrate/P$^+$ substrate
22 N$^-$ epitaxial layer (drift layer)
23 P$^+$ layer (second-conductivity-type region for protecting gate oxide film)
24 P$^-$ epitaxial layer
25 N-counter layer
26 contact auxiliary layer for a (P$^+$) base region
27 (N$^+$) source region
28 gate oxide film
29 gate electrode (polycrystalline Si layer)
30 interlayer insulating film
31 Al film layer
32 Ni film layer
33 Ti/Ni/Au film layer
34 protection film
35 (P$^-$ epitaxial layer 4) joining portion 36 (P+ layer 3) joining portion
37 (N− epitaxial layer 2) connecting-portion lower portion
38 channel region
39 outline of a depletion layer
40 divided region (of the base region 4)
41 divided region (of the P+ layer 3)
42 cell unit
43 gap of outlines of depletion layers
44 N-well layer
45 contacting portion (stripe cell)
46 contacting portion (hexagonal cell)

The invention claimed is:

1. A vertical high-voltage semiconductor device comprising:
 a first-conductivity-type semiconductor substrate;
 a first-conductivity-type semiconductor layer formed on the semiconductor substrate and having a concentration lower than the semiconductor substrate;
 a high-concentration second-conductivity-type semiconductor layer selectively formed in a surface of the semiconductor layer;
 a second-conductivity-type relatively low concentration semiconductor base layer formed on the first-conductivity-type semiconductor layer and the second-conductivity-type semiconductor layer;
 a first-conductivity-type source region selectively formed in a surface layer of the second-conductivity-type base layer;
 a first-conductivity-type well region formed to penetrate the second-conductivity-type base layer from a surface to the first-conductivity-type semiconductor layer;
 a gate electrode layer disposed via a gate insulating film on at least a portion of a surface exposed portion of the second-conductivity-type base layer interposed between the first-conductivity-type source region and the first-conductivity-type well region;
 a source electrode connected via the first-conductivity-type source region and a contact auxiliary layer to the second-conductivity-type base layer; and
 a drain electrode disposed on a back surface of the first-conductivity-type semiconductor substrate, wherein
 portions of the high concentration second-conductivity-type layer and the second-conductivity-type base layer are joined outside of the well region so as to include a point that is farthest and equidistant from centers of all the source regions facing each other and that is closest and equidistant from end portions farthest from the centers of the source regions in a planar view.

2. The vertical high-voltage semiconductor device of claim 1, wherein
 the vertical high-voltage semiconductor device has:
 a first-conductivity-type semiconductor substrate;
 a first-conductivity-type semiconductor layer formed on the semiconductor substrate by epitaxial growth and having a concentration lower than the semiconductor substrate;
 a high-concentration second-conductivity-type semiconductor layer selectively formed in the semiconductor layer by a ion implantation method;
 a second-conductivity-type base layer with a relatively low concentration formed on the first-conductivity-type semiconductor layer and the second-conductivity-type semiconductor layer by an epitaxial growth method;
 a first-conductivity-type source region selectively formed in a surface layer of the second-conductivity-type base layer; and
 a first-conductivity-type well region formed by an ion implantation method to penetrate the second-conductivity-type base layer from a surface to the first-conductivity-type semiconductor layer.

3. The vertical high-voltage semiconductor device of claim 2, wherein
 the semiconductor material is a semiconductor material with a band gap of 2.2 eV or higher.

4. The vertical high-voltage semiconductor device of claim 2, wherein
 the semiconductor material is silicon carbide.

5. The vertical high-voltage semiconductor device of claim 4, wherein
 a crystallographic plane index of the first-conductivity-type semiconductor substrate indicates a plane tilted by an arbitrary angle greater than or equal to 0 degrees and less than or equal to 10 degrees relative to (000-1).

6. The vertical high-voltage semiconductor device of claim 4, wherein
 a crystallographic plane index of the first-conductivity-type semiconductor substrate indicates a plane tilted by an arbitrary angle greater than or equal to 0 degrees and less than or equal to 10 degress relative to (0001).

7. The vertical high-voltage semiconductor device of claim 1, wherein
 the semiconductor material is a semiconductor material with a band gap of 2.2 eV or higher.

8. The vertical high-voltage semiconductor device of claim 1, wherein
 the semiconductor material is silicon carbide.

9. The vertical high-voltage semiconductor device of claim 8, wherein
 a crystallographic plane index of the first-conductivity-type semiconductor substrate indicates a plane tilted by an arbitrary angle greater than or equal to 0 degrees and less than or equal to 10 degrees relative to (000-1).

10. The vertical high-voltage semiconductor device of claim 8, wherein
 a crystallographic plane index of the first-conductivity-type semiconductor substrate indicates a plane tilted by an arbitrary angle greater than or equal to 0 degrees and less than or equal to 10 degrees relative to (0001).

11. A fabrication method of a vertical high-voltage semiconductor device, comprising:
 epitaxially growing a first-conductivity-type SiC layer acting as a drift layer on a first-conductivity-type SiC semiconductor substrate;
 forming a second-conductivity-type semiconductor layer by implanting ions into a predetermined region of the first-conductivity-type SiC layer;
 epitaxially growing a second-conductivity-type semiconductor base layer on the first-conductivity-type SiC layer and the second-conductivity-type semiconductor layer;
 forming a first-conductivity-type counter layer by implanting ions into portions of the second-conductivity-type semiconductor layer and the second-conductivity-type semiconductor base layer such that respective joining portions of the second-conductivity-type semiconductor layer and the second-conductivity-type semiconductor base layer are partially left; and
 selectively forming in the second-conductivity-type base layer, a source region of a first-conductivity-type source layer and a second-conductivity-type contact layer.

12. The fabrication method of a vertical high-voltage semiconductor device of claim 11, wherein
integrally providing the second-conductivity-type semiconductor region and the base layer with respective joining portions that include a point that is farthest and equidistant from centers of all the source regions facing each other and that is closest and equidistant from end portions farthest from the centers of the source regions in a planar view.

* * * * *